United States Patent
Ahn et al.

(10) Patent No.: US 6,420,954 B1
(45) Date of Patent: Jul. 16, 2002

(54) COUPLED MULTILAYER SOFT MAGNETIC FILMS FOR HIGH FREQUENCY MICROTRANSFORMER FOR SYSTEM-ON-CHIP POWER SUPPLY

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/477,407

(22) Filed: Jan. 4, 2000

Related U.S. Application Data

(63) Continuation-in-part of application No. 09/466,134, filed on Dec. 21, 1999, and a continuation-in-part of application No. 09/458,089, filed on Dec. 10, 1999, now abandoned.

(51) Int. Cl.[7] .................................................. H01F 5/00
(52) U.S. Cl. ........................ 336/232; 336/200; 336/223
(58) Field of Search ................................ 438/401, 402, 438/424; 336/200, 223, 218, 232; 257/390, 692

(56) References Cited

U.S. PATENT DOCUMENTS

| | | |
|---|---|---|
| 4,943,879 A | 7/1990 | Takano et al. |
| 5,124,870 A | 6/1992 | Toyoda |
| 5,279,988 A | 1/1994 | Saadat et al. |
| 5,452,167 A | 9/1995 | Nago |
| 5,519,582 A | 5/1996 | Matsuzaki |
| 5,583,474 A | 12/1996 | Mizoguchi et al. |
| 5,661,449 A | 8/1997 | Araki et al. |
| 5,780,175 A | 7/1998 | Chen et al. |
| 5,802,702 A * | 9/1998 | Fleming et al. ............... 29/608 |
| 5,804,422 A * | 9/1998 | Shimizu et al. ............. 438/125 |
| 6,094,123 A * | 7/2000 | Roy ........................... 336/200 |
| 6,148,500 A * | 11/2000 | Krone et al. ............... 29/602.1 |
| 6,239,683 B1 * | 5/2001 | Roessler et al. ............ 336/200 |

FOREIGN PATENT DOCUMENTS

| | | |
|---|---|---|
| JP | 61199615 * | 9/1986 |

OTHER PUBLICATIONS

Christensen; "Wafer Through–Hole Interconnections with High Vertical Wiring Densities"; IEEE Transactions on Components, Packing, and Manufacturing Technology–Part A., vol. 19, No. 4, Dec. 1996, pp. 516–522.

* cited by examiner

Primary Examiner—Anh Mai
(74) Attorney, Agent, or Firm—Dickstein Shapiro Morin & Oshinsky LLP

(57) ABSTRACT

A microtransformer for a high-performance system-on-chip power supply is disclosed. Through-wafer openings in a substrate allow the primary and secondary wiring on both surfaces of the silicon substrate. An insulating silicon oxide layer is first deposited on all surfaces of the substrate. A magnetic film is further deposited on the silicon oxide layer followed by the application of another insulating layer. Coils are fabricated next by patterned deposition on both sides of the substrate and through the holes. The coils can be, e.g., single coils or primary or secondary coils of a transformer structure, with secondary having one or more output taps to supply different output voltages. For better flux closure, various magnetic layers and insulators can be deposited on top of the windings. For even a better flux closure, the various magnetic layers can be coupled.

103 Claims, 17 Drawing Sheets

COUPLED MULTILAYER SOFT MAGNETIC FILMS FOR HIGH FREQUENCY MICROTRANSFORMER FOR SYSTEM-ON-CHIP POWER SUPPLY

CROSS-REFERENCE TO RELATED APPLICATION

This application is a continuation-in-part of application Ser. No. 09/458,089, filed Dec. 10, 1999 Abn. and a cont-in-part of Ser. No. 09/466,134 filed Dec. 21, 1999.

FIELD OF THE INVENTION

The present invention relates generally to semiconductor circuits, and in particular to a method for the fabrication of microtransformers which can be used in a system-on-chip power supply.

BACKGROUND OF THE INVENTION

The system-on-chip concept refers to a system in which, ideally, all the necessary integrated circuits are fabricated on a single die or substrate. Various packaging schemes have been proposed to achieve integration of chips with different functionalities in a single package by mounting them on a silicon interposer to form a circuit module. For example, the simplest scheme is the chip-on-chip module, in which a microprocessor chip and a memory chip are stacked together, face to face or through a silicon interposer, using micro bump bonding (MBB) technology.

Integrating all system components into one chip or a plurality of chips in a single module affords a smaller product size, higher speed, and increased reliability. Power consumption remains, however, a critical issue, especially for portable devices having complex circuitry, which requires an always increasing number of devices to be integrated on one chip.

In an effort to reduce the power consumption, power supply components, such as DC-DC converters, intelligent power LSIs, and thin film magnetic devices, have been integrated into one chip. Since a typical DC-DC converter consists of semiconductor devices, resistors, capacitors, and electromagnetic components, such as transformers and inductors, among others, a key issue for the system-on-chip DC-DC converter is integrating both semiconductor and electromagnetic devices into a chip, while reducing the size of the electromagnetic components, which tend to occupy a large amount of space.

For example, U.S. Pat. No. 5,279,988 to Saadat and Thomas teaches a processes for fabrication of microcomponents integrated circuits, including microtransformers and microinductors, using multilevel metallization involving six layers of insulators and a coil winding.

U.S. Pat. No. 5,583,474 to Mizoguchi et. al. discloses "a planar magnetic element" consisting of a pair of planar spiral coils sandwiched by two thin magnetic films to form an inductor or a transformer.

Similarly, U.S. Pat. No. 5,519,582 to Matsuzaki discloses a magnetic induction coil directly mounted on, and integrated with, a semiconductor wafer containing integrated circuitry. Grooves are etched in the reverse face of the wafer substrate, an insulating film is applied, and conducting materials fill the grooves forming therefore the coil.

The implementation of a truly high performance system-on-chip DC-DC converter with electromagnetic elements poses various problems, mainly because of the growing demand for increased efficiency at high frequency operations. High frequency operations are highly desirable for electromagnetic elements since they permit a decrease in the size of the device while affording the same reactance. Yet, at frequencies higher than 1 MHz, operating frequency increases tend to have a detrimental effect on the efficiency of the devices. Multilayered integrated circuit structures for forming electromagnetic components have attempted to address the efficiency issue, but have reached only limited results.

Another disadvantage of electromagnetic devices operating at high frequencies is the limitation posed by the width of the winding conductor. Because the electromagnetic element coil is formed by a thin film conductor, its width must be limited to form the desired fine pitch structure. Consequently, the current capacity of the magnetic induction is also limited and, in turn, limits the current density in the coil.

Further, planar electromagnetic elements fabricated today are not yet small enough to be integrated with other circuit elements, making it practically impossible to manufacture sufficiently small system-on-chip power supplies.

There is needed, therefore, a method for further downsizing of electromagnetic elements, for example coils and microtransformers on ICs operating at high frequencies with high efficiency, low losses, and high magnetic permeability. An electromagnetic element for use in a circuit section that will only slightly influence other components of the circuit, will have a sufficiently high current capacity and high inductance, and will occupy a minimal substrate area is also needed, as well as a simple process for fabricating such an electromagnetic element.

SUMMARY OF THE INVENTION

The present invention provides an integrated circuit microtransformer capable of operating at high frequencies with high efficiency, low losses, and high magnetic permeability.

The microtransformer of the present invention uses a silicon substrate with a pair of through-holes on which an insulating silicon oxide layer is first deposited on all surfaces of the substrate. A magnetic film, such as Permalloy or others, is further deposited on the silicon oxide layer followed by the application of another insulating layer. Coils are fabricated next by patterned deposition on both sides of the substrate and through the holes. The pair of through-holes allows the winding of a single coil or the winding of primary and secondary coils to pass through the holes and thus to reside on both surfaces of the substrate. The typical through-hole size is approximately 1 mm, which can accommodate, for example, up to 83 windings of 8 $\mu$m lines on a 12 $\mu$m spacing. The coils can be, for example, single coils, or primary or secondary coils of a transformer structure, with secondary coils having one or more output taps to supply different output voltages. For better flux closure, various magnetic layers and insulators can be deposited on top of the windings. The primary and secondary windings of a transformer can also be wound through the holes, but at different levels.

Advantages and features of the present invention will become more readily apparent from the following detailed description of the invention, which is provided in connection with the accompanying drawings.

DETAILED DESCRIPTION OF THE PREFERRED EMBODIMENTS

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is defined by the appended claims.

The term "substrate" used in the following description includes any semiconductor-based structure having an exposed silicon surface in which the structure of this invention may be formed. The term "substrate" is to be understood as including substrates formed of silicon, silicon-oninsulator, doped and undoped semiconductors, epitaxial layers of silicon supported by a base semiconductor foundation, and other semiconductor structures. Furthermore, when reference is made to a substrate in the following description, previous process steps may have been utilized to form regions or junctions in, or material layers on, the base semiconductor structure or foundation.

Figure 1:
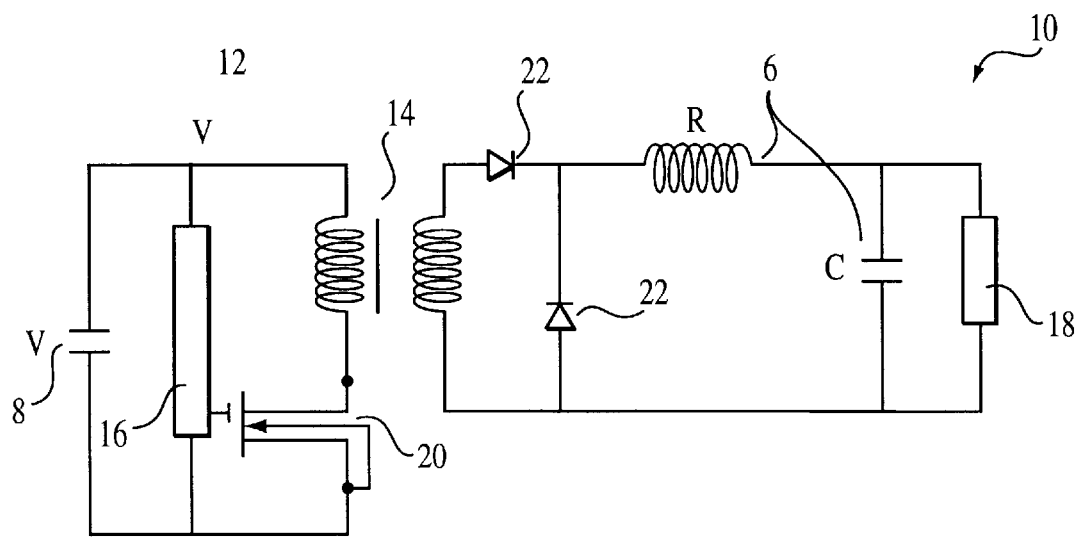
FIG. 1 is a schematic diagram of a conventional DC-DC converter.

Referring now to the drawings, where like elements are designated by like reference numerals, FIG. 1 illustrates a circuit diagram of a single-ended forward DC-DC converter 10, which is a key component for a power supply. The DC-DC converter 10 comprises a voltage source 8, a microtransformer 14, a switch transistor 20, a control circuit 16 for switch-operating transistor 20 on and off, a rectifier 22, an R/C filter 6, and a load circuit 18. The DC-DC converter 10 can be used to step up or down a DC input voltage V. The output voltage of microtransformer 14 is rectified by diode rectifiers 22 and smoothed by R/C circuit 6 to supply an output DC voltage to load circuit 18.

Figure 2:
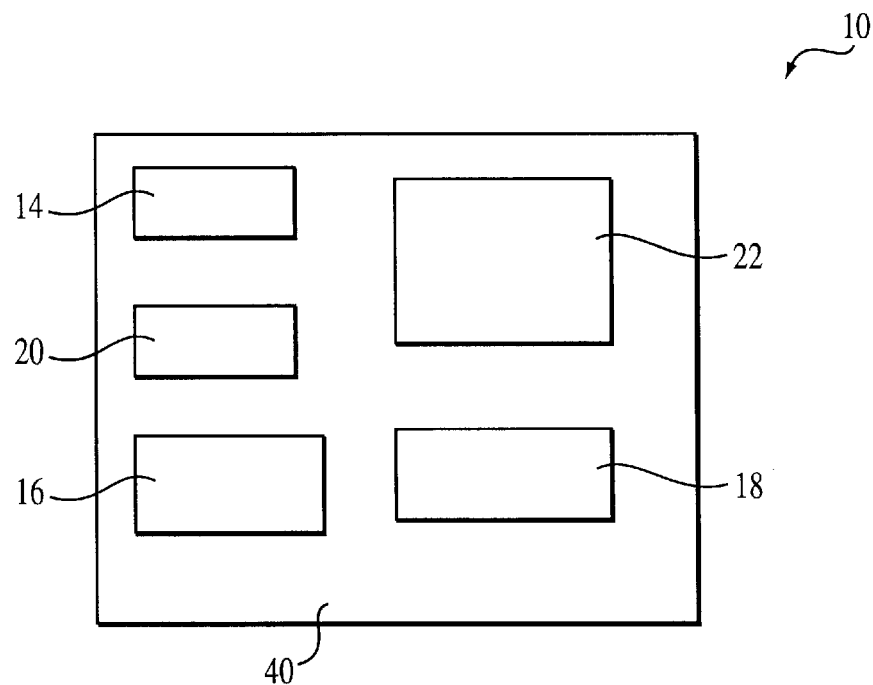
FIG. 2 illustrates a one-chip power supply DC-DC converter incorporating a microtransformer of the present invention.

FIG. 2 further schematically illustrates a top view the power supply DC-DC converter 10 integrated on a single semiconductor substrate 40. With microtransformer 14 integrated on the same substrate as the other components, the one-chip DC-DC converter 10 has increased reliability and can attain a higher operating frequency with a reduction in the size of the power supply because of a reduced number of parts and shorter wire bonding length. Substrate 40 may also have other digital or analog circuitry integrated thereon, including, for example, logic, processor, and/or memory circuits.

The fabrication of the components of power supply DC-DC converter 10 on substrate 40, save transformer 14, is accomplished by using well-known integrated circuit fabrication techniques. The fabrication of transformer 14 will be discussed greater in detail below.

Figure 3:
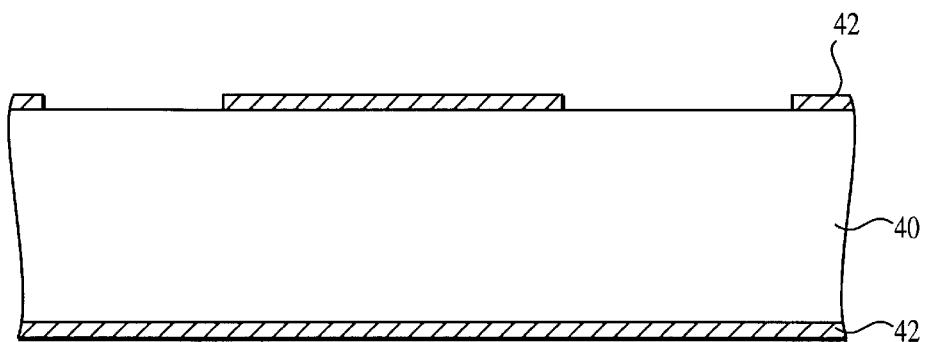
FIGS. 3–5 show a portion of a silicon substrate undertaking a sequence of steps for through-hole fabrication, performed in accordance with a method of forming a microtransformer of the present invention.
Figure 4:
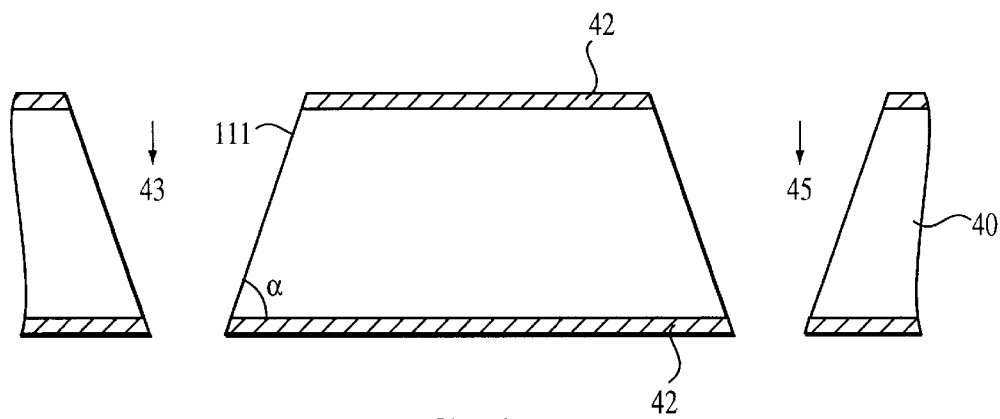
Figure 5:
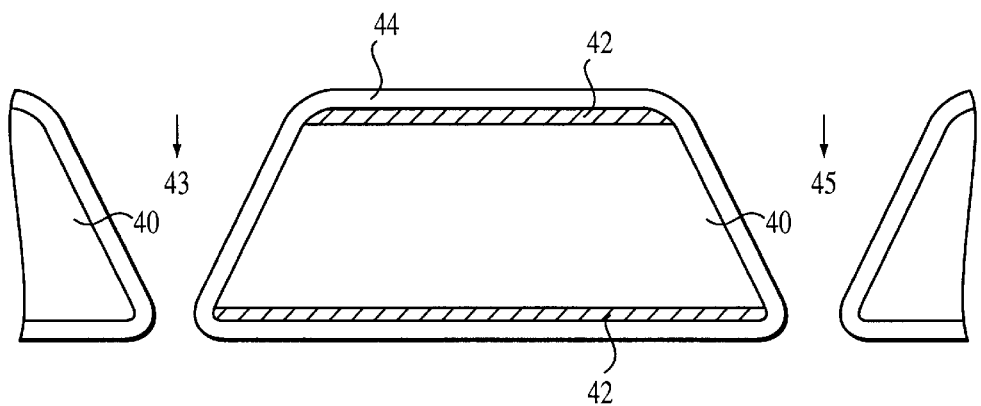

FIGS. 3–5 illustrate a sequence of steps for forming a pair of through-holes 43, 45, in the substrate 40 in the area where transformer 14 will be fabricated. This is the first step in the fabrication of transformer 14. Precise details of one through-hole fabrication technique that can be employed were given recently by Christensen et al., in *Wafer Through-Hole Interconnections with High Vertical Wiring Densities*, IEEE Trans. on Components, Packaging and Manufacturing Technology, Pt. A, vol. 19, no. 4, 516–22 (1996), the disclosure of which is incorporated by reference herein, and will not be repeated in detail here. A brief summary of these steps is believed helpful to attain a better understanding of the subsequent fabrication steps.

The through-hole fabrication is an anisotropic etching into an oriented silicon substrate with rectangular openings in the etch mask on one side of the wafer along the lattice planes. The definition of a pair of holes in the silicon substrate 40 of FIG. 3 begins by forming an etch mask of a thermally grown oxide 42 on both sides of the silicon substrate 40. As shown in FIG. 3, the mask 42 on one side of the substrate 40 is patterned to have the rectangular openings therein.

Next, as shown in FIG. 4, the masking layer 42 with rectangular mask openings is used to anisotropically etch the substrate 40 from one surface of substrate 40 towards the other surface of substrate 40 and through the bottom oxide layer 42 in an aqueous etching solution, so that holes 43 and 45 are formed. The side wall of each hole is at a 54.7° angle, α, that is defined by the openings in the masking layer 42 and lattice plane 111 of the substrate 40. The typical hole size is approximately 1 mm square at the upper surface of the substrate 40.

Next, as shown in FIG. 5, a thick thermal oxide 44 is grown over all exposed areas of the substrate, including the side walls defining holes 43, 45. This layer acts as an insulating layer between the substrate and subsequent formed layers, and it also rounds the sharp corners at the top and bottom of the through-holes 43 and 45.

Figure 6:
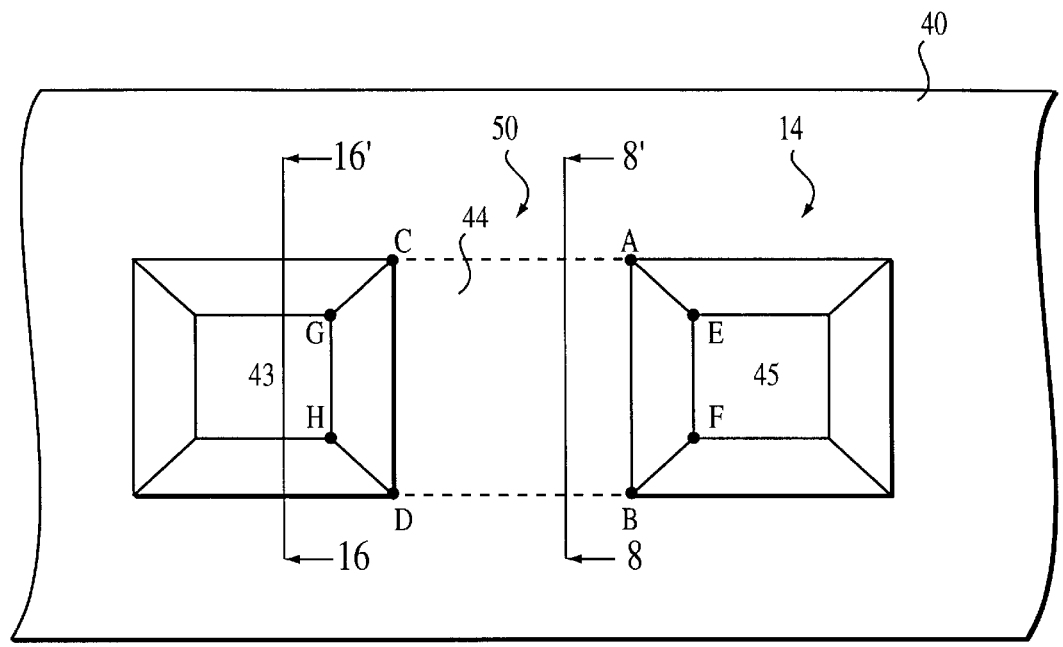
FIG. 6 is top view of a representative substrate of the present invention with the through-holes fabricated therein.
Figure 7:
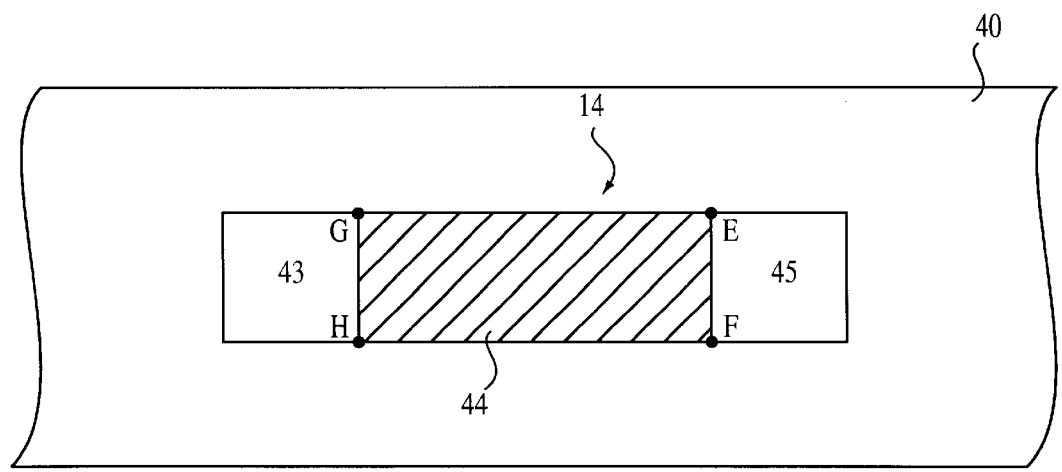
FIG. 7 is a bottom view of a representative substrate of the present invention with the through-holes fabricated therein.

FIG. 6 shows a top view of the substrate 40 with the holes 43, 45 formed therein and with the fabricated oxide layer 44. FIG. 7 represents a bottom view of the substrate 40 with the through-holes 43, 45 formed therein and the oxide layer 44.

Oxide layer 44 can be formed over the entire top and bottom surfaces of the substrate 40 and then etched to only remain on these surfaces in the area between holes 43 and 45 and on the side walls shown as CDGH and ABEF in FIG. 6. Alternatively, oxide layer 44 can be left to cover the entirety of the top and bottom surfaces of substrate 40, depending on other processing steps which may be utilized to create other structures in substrate 40.

Once the through-holes 43 and 45 are formed and the oxide layer 44 grown, the next step is the fabrication of a transformer core 50 on silicon substrate 40 in the area between holes 43,45. This area is illustrated in FIG. 6 as the area bounded by letters A, B, C and D on the top surface of the substrate; the area of the side wall of hole 43 bounded by the letters C, D, G and H; the area of the side wall of the hole 45 bounded by the letters A, B, E and F; and the area on the lower surface of the substrate 40 bounded by the letters E, F, G and H, as shown in FIG. 7.

In our exemplary embodiment, substrate 40 is a silicon substrate of <100> crystal orientation. It can be undoped in the area in which transformer 14 will be formed, or it can be doped to either a p or n conductivity as necessary or convenient for forming devices in other portions of substrate 40.

Figure 8:
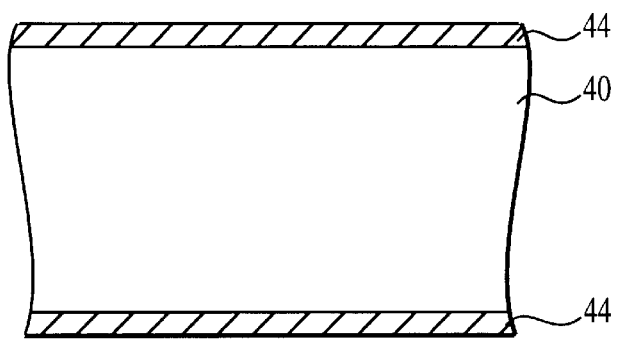
FIG. 8 is a cross-sectional view of the representative microtransformer of FIG. 6, taken along line 8–8', at an intermediate stage of processing and in accordance with a first embodiment of the present invention.

Referring now to FIG. 8, which is a partial cross-sectional view along the line 8–8' in FIG. 6, oxide layer 44 is preferably an oxide, such as a thermal oxide of silicon, or a nitride. Oxide layer 44 is approximately 1 μm thick and is a first insulating layer, which also acts as a substrate passivation layer. A high temperature polymer film such as a polyimide can also be used in place of oxide layer 44. For example, a polyimide with a low dielectric constant (ε=3) may be deposited by spin coating followed by curing, if required by electrical design.

Figure 9:
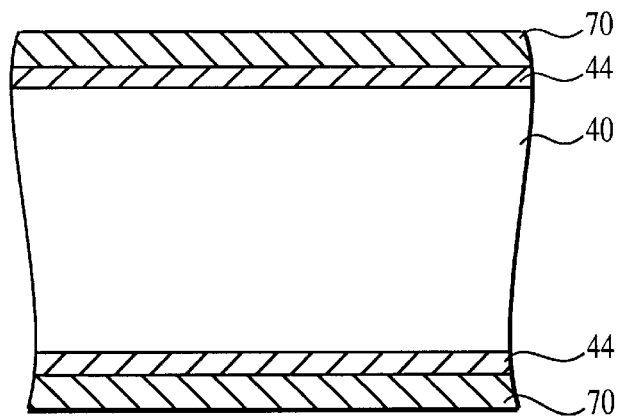
FIG. 9 is a cross-sectional view of the representative microtransformer according to the present invention at a stage of processing subsequent to that shown in FIG. 8.

Reference is now made to FIG. 9. Subsequent to the formation of oxide layer 44, either a dry process or a wet process may be employed for the deposition of a soft magnetic film structure 70 on top of insulating layer 44. The total thickness of the soft magnetic film structure 70 of FIG. 9 is between about 2 to about 4 μm.

The magnetic material for the soft magnetic layer 70 may be one of the following choices: (1) magnetic films laminated with insulating spacers, such as Permalloy (NiFe), NiFeMo, Co—Zr, CoZrRe, CoFeSiB, CoNbZr, and Co—Cr—O granular films; or (2) a magnetic film laminated with another magnetic film, such as Fe—X—N alloy or Fe—X—B—N alloy where X is at least one atom selected from the group consisting of Zr, Hf. Ti, Nb, Ta, V, Mo, W, and Cr. For example, Fe/FeN, FeCoV/FeNiMo, FeN/AlN, CoBN/AlN, and FeAl/FeN are only few of the choices for the material of the magnetic layer 70. Ultimately, the choice depends upon the deposition requirements of the magnetic material and upon the further processing requirements such as post deposition annealing and patterning. Ni—Fe or other Permalloy materials which can be easily formed through sputtering are preferred, although other materials with analogous properties may work as well.

Figure 10:
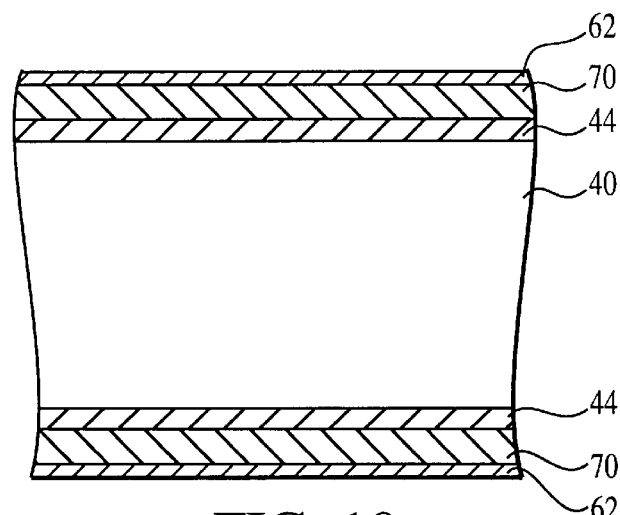
FIG. 10 is a cross-sectional view of the representative microtransformer according to the present invention at a stage of processing subsequent to that shown in FIG. 9.

Referring now to FIG. 10, a second insulating layer 62 is deposited over magnetic layer 70. The second insulating layer 62 provides electrical isolation for the winding wires. It must be noted that insulating layers, such as layer 62, are necessary for the isolation of the winding wires only when the magnetic material of the soft magnetic layers, such as layer 70, is a conductive magnetic material, such as Ni—Fe alloy or a ferromagnetic material. When, however, the magnetic material of the soft magnetic layers is an insulating magnetic material, such as an iron oxide, for example, insulating layers, such as layer 62, that isolate the winding wires from the magnetic layers are not necessary.

Any standard IC technique for fabricating the insulating layer 62 can be employed, such as simple evaporation or sputtering. For example $SiO_2$ or $Si_3N_4$ may be deposited by CVD to a thickness of 0.5 to 1 $\mu$m. A high temperature polymer film such as a polyimide may be employed also.

Next, the coil windings are formed. Standard IC technology for the fabrication of primary and secondary coil windings involves optical lithography and deposition of high-conductivity metals such as copper or silver with a fine pitch. Either a dry process, such as evaporation or sputtering of a metal film followed by dry etching, or a wet process, such as electrochemical plating to form the individuals conductors, could be employed. In both cases, typical width and height of the coil winding is 8 $\mu$m each with spacing of 4 $\mu$m between primary and secondary windings.

Figure 11:
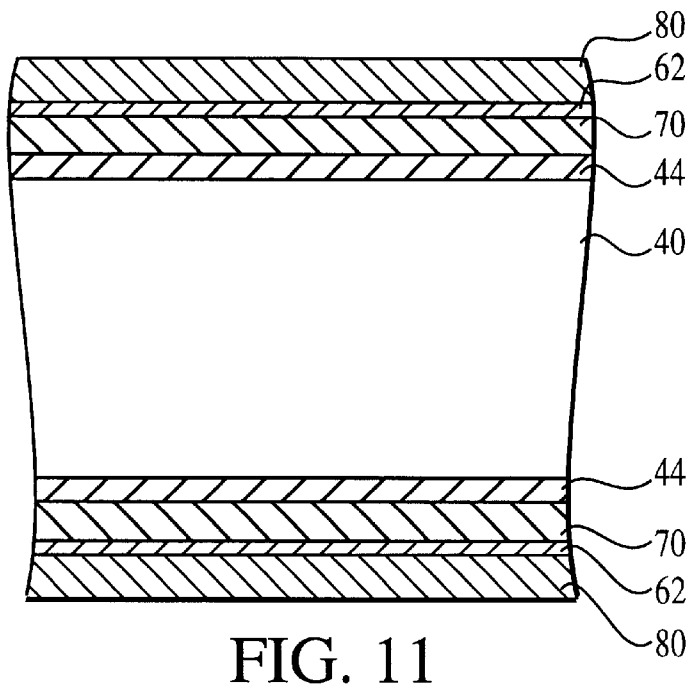
FIG. 11 is a cross-sectional view of the representative microtransformer according to the present invention at a stage of processing subsequent to that shown in FIG. 10.

Reference is now made to FIG. 11, which illustrates the beginning of the deposition of coil winding structure 100 (FIG. 14) by a dry process, such as sputtering. The first step under this dry process, as shown in FIG. 11, is the formation of a conductive material layer 80 over the second insulating layer 62, which in turn covers magnetic layer 70. The conductive material layer 80 is formed of copper (Cu), or other suitable conductive material, having a thickness of approximately 10 $\mu$m.

Figure 12:
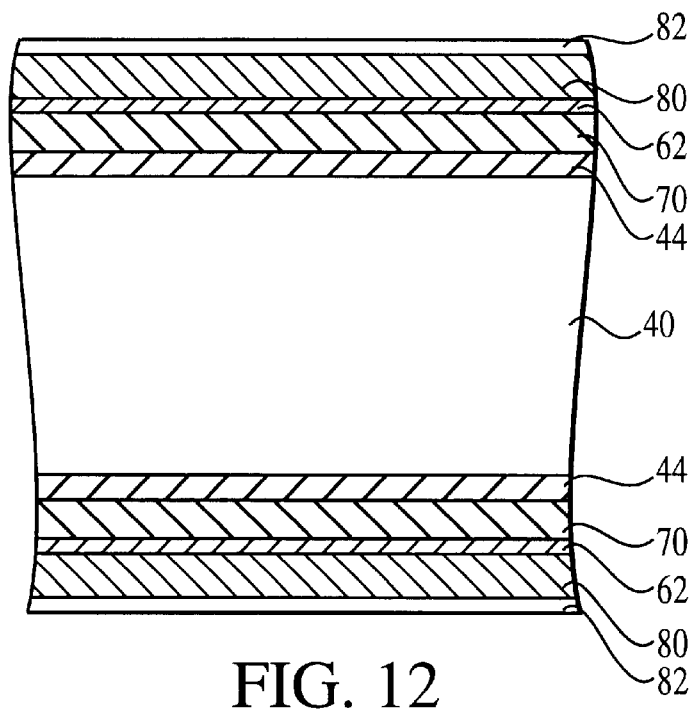
FIG. 12 is a cross-sectional view of the representative microtransformer according to the present invention at a stage of processing subsequent to that shown in FIG. 11.
Figure 13:
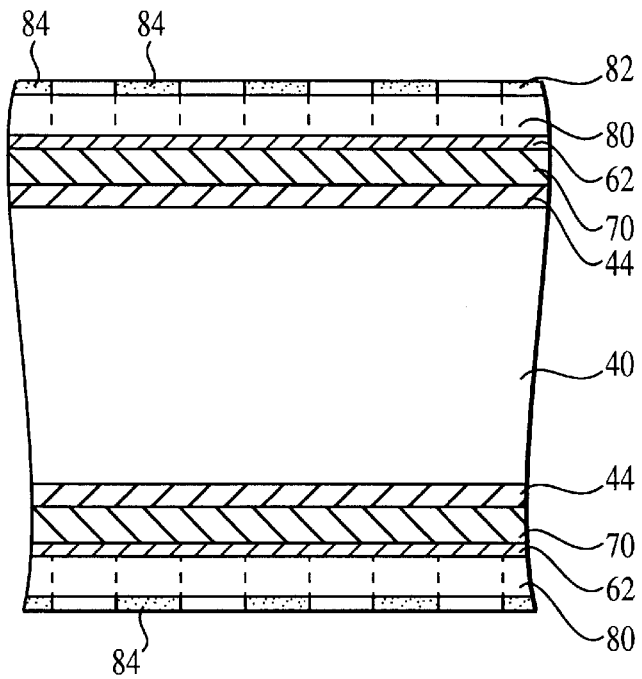
FIG. 13 is a cross-sectional view of the representative microtransformer according to the present invention at a stage of processing subsequent to that shown in FIG. 12.

As illustrated in FIG. 12, as part of the patterning of conductive material layer 80, a photoresist film 82 is then coated on the conductive copper layer 80. A UV mask (not shown) is placed over the photoresist film 82, which has the conductor pattern therein for forming a coil layer. As in any conventional photolithography process, the mask has areas which allow UV light to pass through and contact the photoresist layer 82. The mask also includes areas that block the UV light from contacting the photoresist layer 82. The UV light contacts the photoresist mask layer 82 and develops it so that developed photoresist areas 84 are left as shown in FIG. 13.

Figure 14:
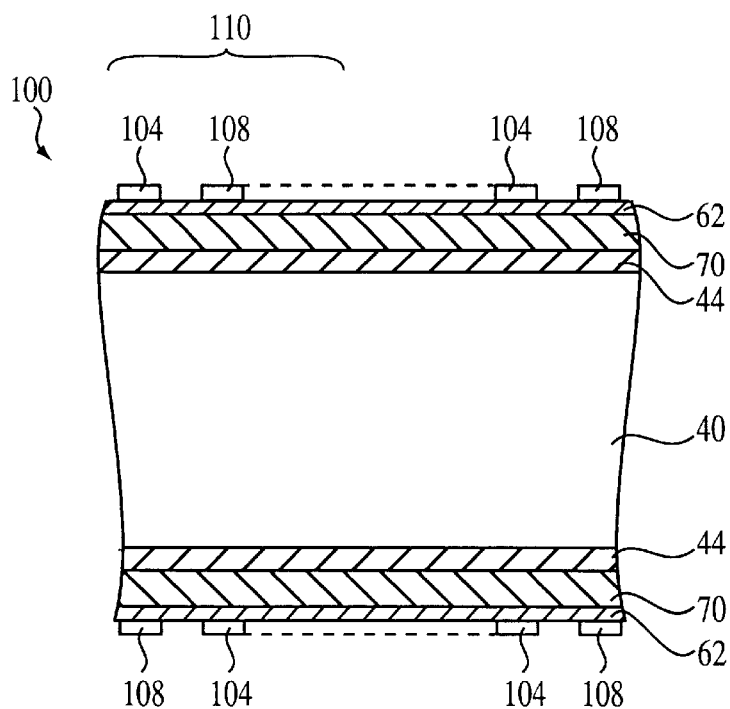
FIG. 14 is a cross-sectional view of the representative microtransformer according to the present invention at a stage of processing subsequent to that shown in FIG. 13, illustrating a fabricated coil structure.

The underlying conductive material layer 80 is next etched through the developed photoresist film 82. Etching can be done with a plasma etch and then the remaining photoresist film areas 84 are removed with subsequent processing. The resultant coil structure 100 is illustrated in FIG. 14. The coil structure 100 which is formed contains both primary, such as 104, and secondary, such as 108, coils of microtransformer 14 with their windings interleaved. Alternatively, if desired, the conductive material layer 80 can be etched to form only a single continuous coil.

Figure 15:
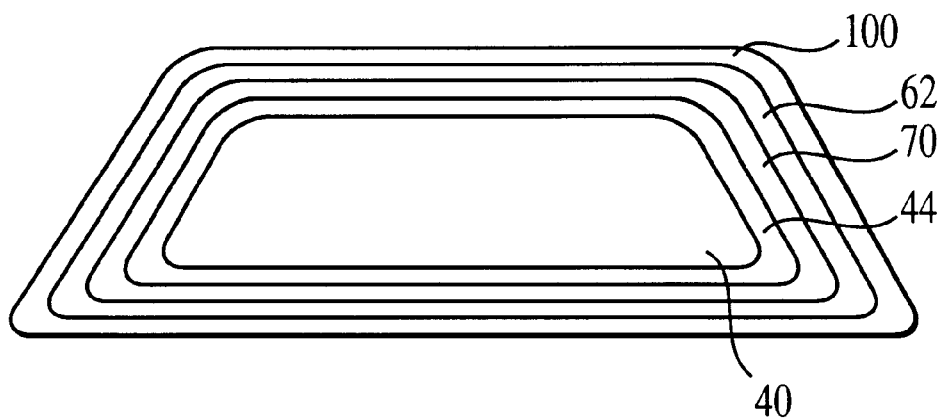
FIG. 15 is a cross-sectional view similar to that of FIGS. 3–5, showing a fabricated coil structure of the representative microtransformer in accordance with the first embodiment of the present invention.
Figure 16:
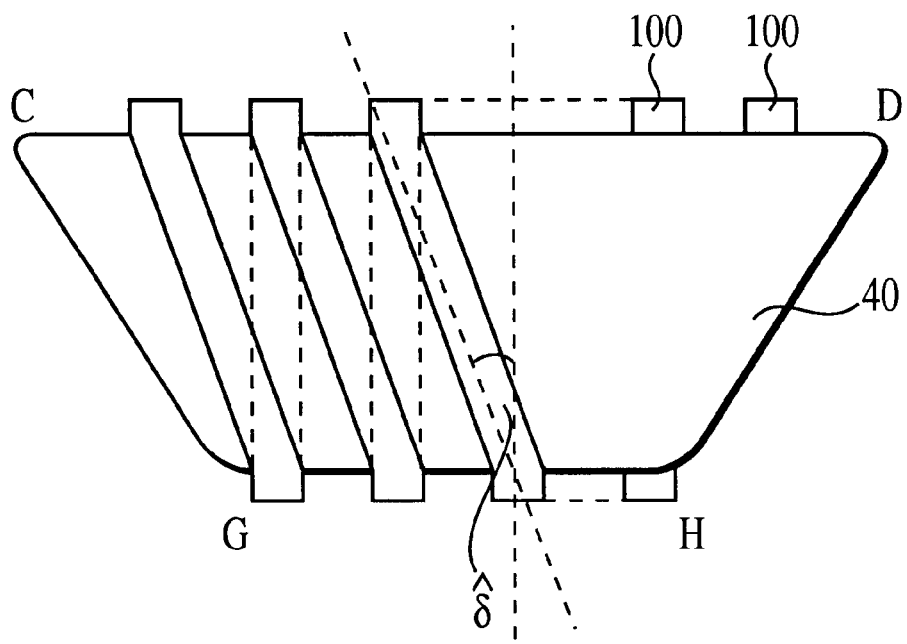
FIG. 16 is a is a cross-sectional view of the representative microtransformer of FIG. 6, taken along line 16–16' and in accordance with the first embodiment of the present invention.
Figure 17:
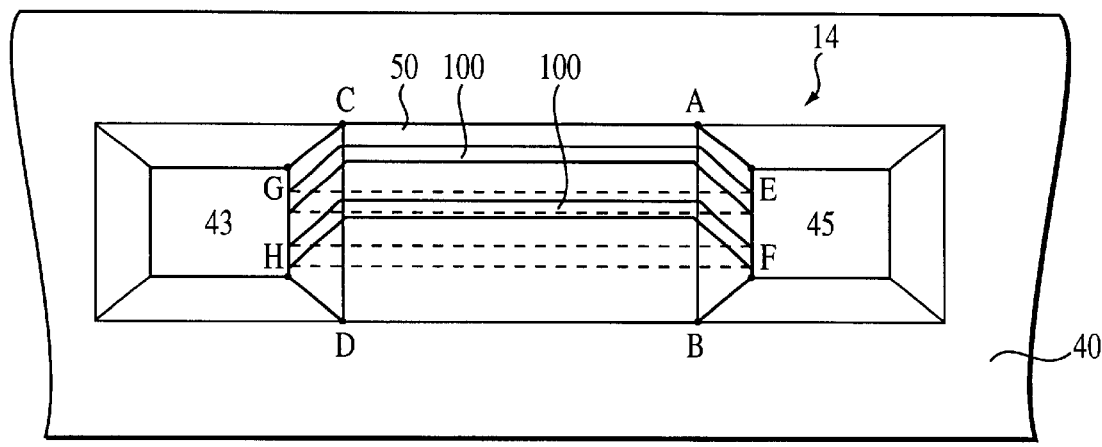
FIG. 17 is a top view of the representative microtransformer of the first embodiment of the present invention with fabricated coil structure formed on both sides of the substrate and through the holes.

A cross-sectional view of the silicon structure 40 of FIG. 14, taken along the line 16–16' shown in FIG. 6, after fabrication of the coil structure 100, is shown in FIG. 16. The inclination of coil winding is defined by angle δ. A side view of the microtransformer 14 with the fabricated coil structure 100 formed on both sides of the substrate 40 and through the holes 43 and 45 is illustrated in FIG. 15. A top view is shown in FIG. 17.

Deposition is not the only method that could be employed for forming the conductive material layer 80. The conductive material layer 80 can be also electroplated over insulating layer 62. Under this wet process and using copper as the conductive material, a thick copper layer may be electroplated on top of a thin, vacuum-evaporated (sputtered) base metal (i.e. base copper) having a thickness of approximately 1000 Å. The base metal adheres to a suitable bonding layer that is formed directly on the substrate insulating material. The bonding layer may be composed of bonding materials such as titanium (Ti), titanium-tungsten (Ti/W) or chromium, among others. The role of the bonding layer is to form a strong mechanical and chemical bond between the copper conductor and the underlying substrate to help prevent peeling of the formed conductive layer off the substrate. After the conductive layer 80 is electroplated on insulating layer 62, it can be etched in the manner described above to form the coil structure 100.

As known in the art, increasing the number of coil windings will increase the electrical resistance of the coil. Thus, to reduce the electrical resistance, it is desirable to employ coils with larger cross section that are fabricated with a low-resistivity conductor such as copper. Of these, copper windings with an aspect ratio of at least one or higher are recommended. For example, the copper coils could have 8 $\mu$m in width and height each, with a spacing of 4 $\mu$m between the primary and the secondary windings.

Figure 18:
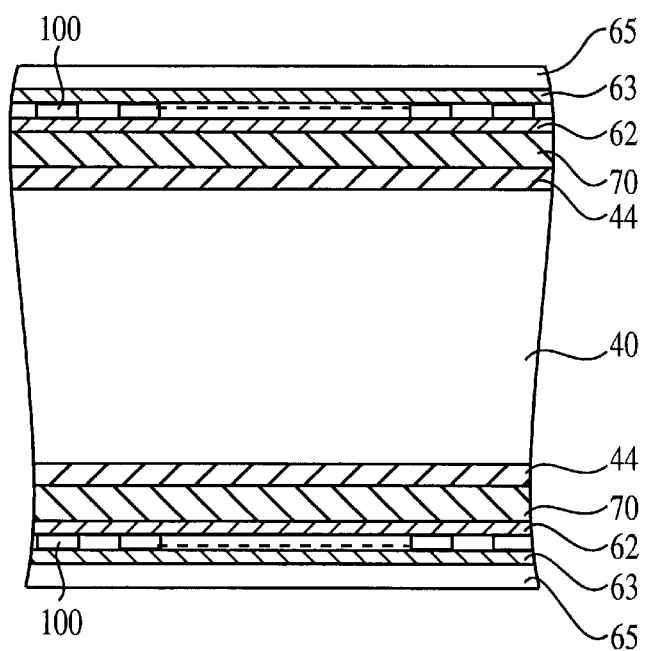
FIG. 18 is a cross-sectional view of the representative microtransformer according to a first embodiment of the present invention at a stage of processing subsequent to that shown in FIG. 14.

Following coil formation, a top protective insulating layer 63 is next deposited over the coil structure 100 as shown in FIG. 18. A passivating layer 65 can be also deposited on top of top protective insulating layer 63. Vias can be provided as needed to interconnect microtransformer 14 with other structures of DC-DC converter 10, which are integrated elsewhere in substrate 40.

Figure 19:
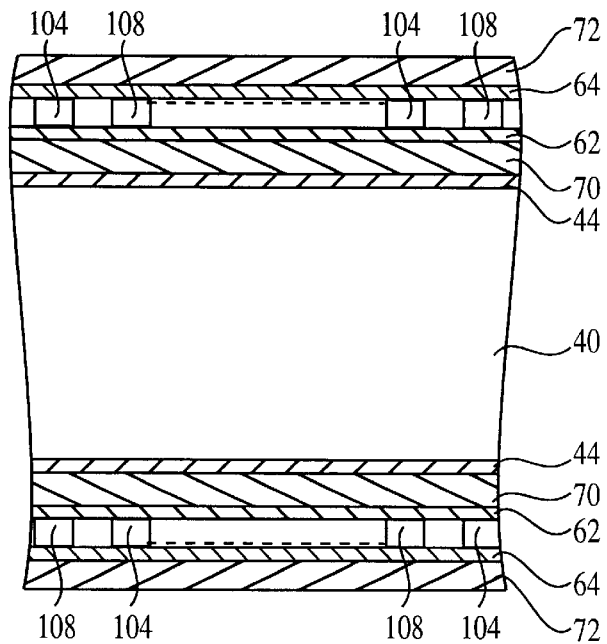
FIG. 19 is a cross-sectional view of the representative microtransformer according to the present invention at a stage of processing subsequent to that shown in FIG. 14 and in accordance with a second embodiment of the invention.

In another embodiment, and in order to increase the flux coupling between the primary and the secondary coils, another magnetic layer 72 can be applied on top of the coil winding structure 100 before the final top protective insulating layer 63 or passivating layer 65 are applied. This is shown in FIG. 19. First, a second insulating layer 64 is applied over the coil structure 100 and then another magnetic layer 72 is applied. Any standard IC processing technique, such as simple evaporation, sputtering, or electroplating, may be used to deposit insulating layer 64. For example $SiO_2$ or $Si_3N_4$ may be deposited by CVD to a thickness of 0.5 to 1 $\mu$m.

Figure 20:
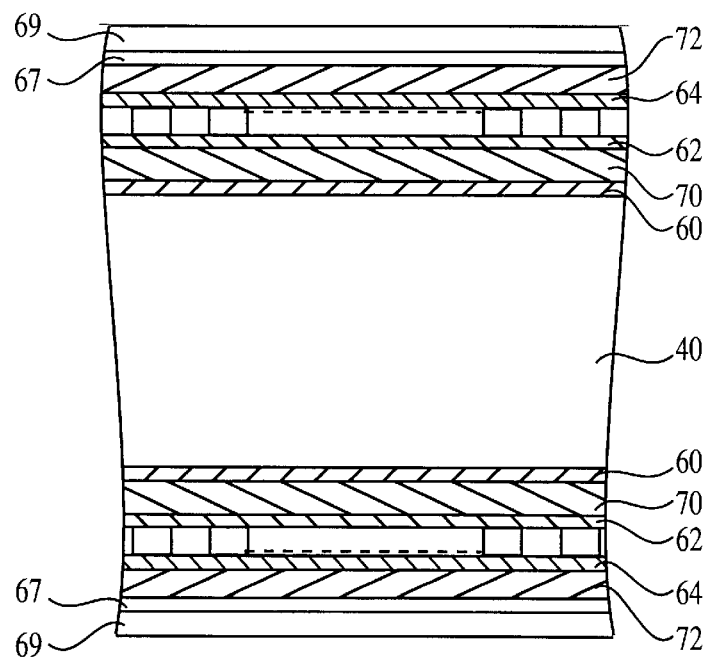
FIG. 20 is a cross-sectional view of the representative microtransformer according to the present invention at a stage of processing subsequent to that shown in FIG. 19.

Layer 72 can now be formed over layer 64 in the same manner and to the same thickness as layer 70. The same types of materials as employed for layer 70 can also be used for layer 72. Layer 72 may then be covered by another top protective insulating layer 67 and a passivating layer 69 to complete the transformer structure, as illustrated in FIG. 20. In both the FIG. 18 and FIG. 20 structures, the final top protective insulating and passivating layers (63, 65 in FIG. 18) (67, 69 in FIG. 20) can be formed as a single layer, the two layers shown, or as three or more layers of top protective insulating and/or passivating layers.

Figure 21:
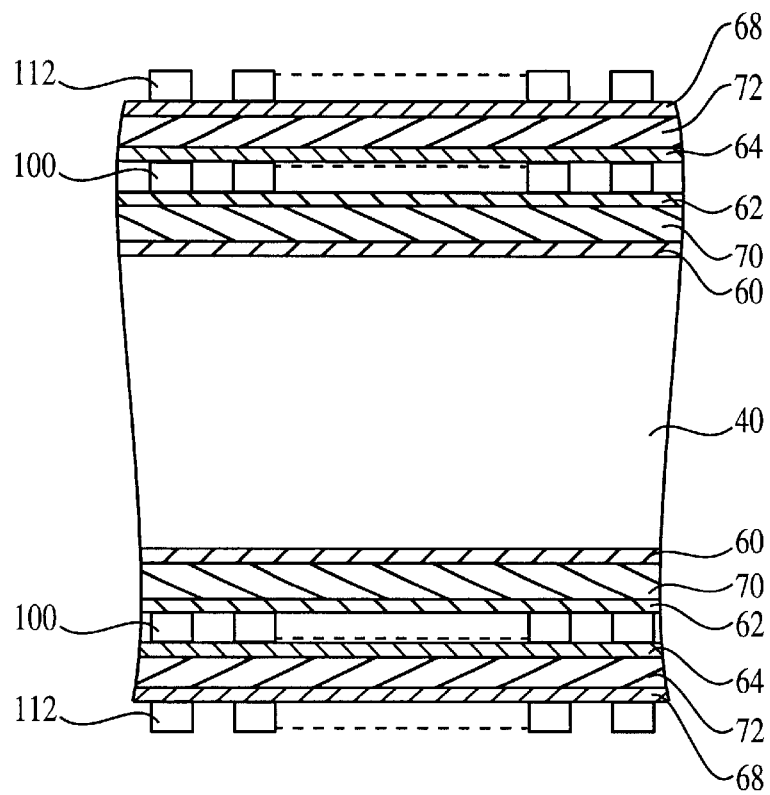
FIG. 21 is a cross-sectional view of the representative microtransformer according to the present invention at a stage of processing subsequent to that shown in FIG. 19 and in accordance with a third embodiment of the present invention.
Figure 22:
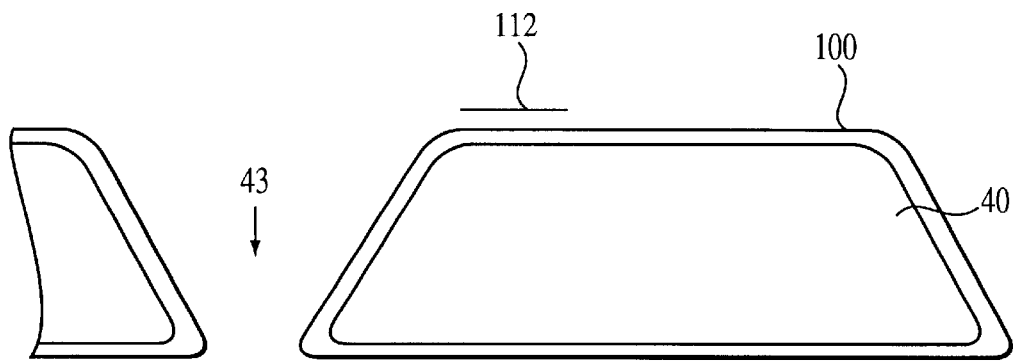
FIG. 22 is a cross-sectional view similar to that of FIGS. 3–5 showing two layers of a fabricated coil structure of the representative transformer of the present invention and in accordance with a third embodiment.

According to another embodiment of the present invention, to further improve the magnetic flux coupling, a second coil winding structure 112 can be deposited on top of the first coil winding structure 100 using the same techniques as used to form coil winding structure 100. In this embodiment, which is illustrated in FIGS. 21–22, the second coil winding structure 112 is formed on top of an insulating layer 68, which in turn covers the magnetic layer 72. The first coil winding structure 100 can be one of the primary and secondary windings of the microtransformer 14, while the secondary coil winding structure 112 can be used as the other of the primary and secondary winding. The second winding layer 112 may be provided with several output taps to provide output voltages.

In yet another embodiment of the present invention, to further improve the magnetic flux coupling of the coils, two magnetic layers can be applied on top of the coil structure, before the final top protective insulating layer or passivating layer are applied, in a way so that the two magnetic layers are joined for flux closure. This embodiment is illustrated in FIGS. 23–32, which show cross-sectional views along the line 8–8' in FIG. 6, but with a larger lateral portion of the silicon substrate 40 illustrated in order to show the side edges of the various material layers.

Figure 23:
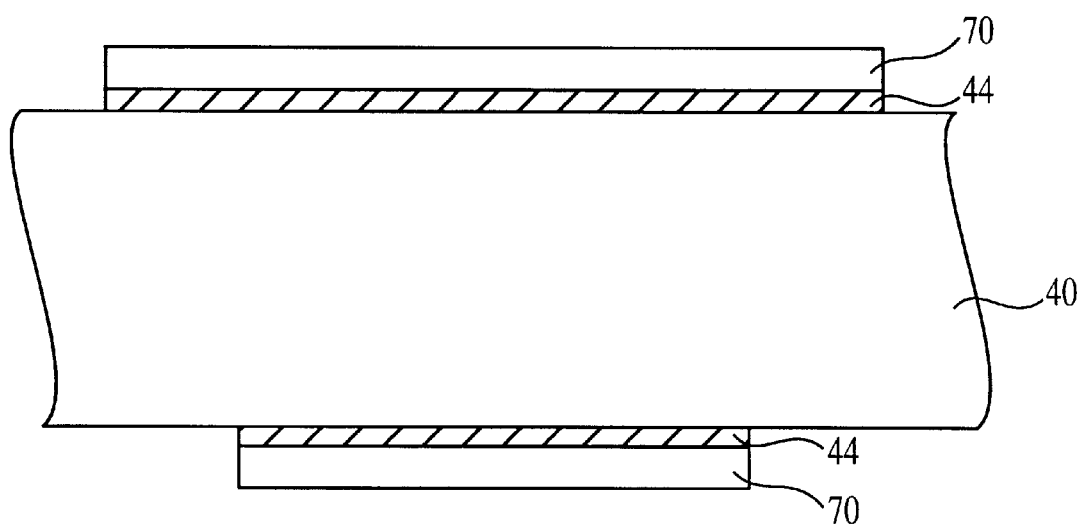
FIG. 23 is a cross-sectional view of the representative microtransformer of FIG. 6, taken along line 8–8', at an intermediate stage of processing, illustrating the closure of the magnetic fluxes and in accordance with a fourth embodiment of the present invention.
Figure 24:
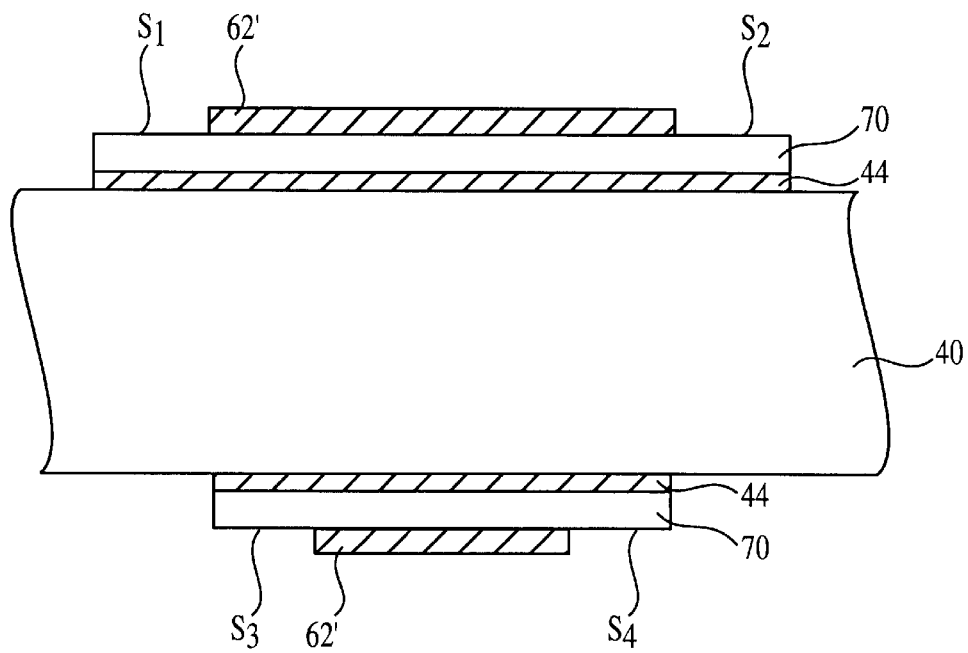
FIG. 24 is a cross-sectional view of the representative microtransformer according to the present invention at a stage of processing subsequent to that shown in FIG. 23.

Reference is now made to FIG. 23, which is the equivalent of FIG. 9. After the deposition of a first soft magnetic layer 70 over an oxide layer 44, the substrate is masked so that a second insulating layer 62' (FIG. 24) is deposited only over the exposed area of the soft magnetic layer 70. As illustrated in FIG. 24, oxide layer 62' is formed such that uncovered regions $S_1$ and $S_2$ exist on both right and left sides of the upper surface of the upper magnetic layer 70, and other uncovered regions $S_3$ and $S_4$ exist on both right and left sides of the lower surface of the lower magnetic layer 70. The uncovered regions $S_1$, $S_2$, $S_3$, and $S_4$ define the areas where a second magnetic layer will subsequently join the first soft magnetic layer 70, as will be described in more details below.

All other subsequent layers of material, save the second magnetic layer and the top insulating and passivating layers, will not be formed in the uncovered regions $S_1$ and $S_2$ of the upper surface and the uncovered regions $S_3$ and $S_4$ of the lower surface of the silicon substrate 40. Thus, as shown in FIGS. 25–28, coil winding 100' is formed only over the insulating layer 62', and not over the whole surface of the first soft magnetic layer 70. The deposition and patterning of coil winding structure 100' involves the same process for the fabrication of primary and secondary coil windings described above with reference to FIGS. 11–14.

As such, either a dry process, such as evaporation or sputtering of a metal film followed by dry etching, or a wet process, such as electrochemical plating to form the individuals conductors, could be employed to form coil winding structure 100'. In both cases, typical width and height of the coil winding is 8 µm each with spacing of 4 µm between primary and secondary windings.

Figure 25:
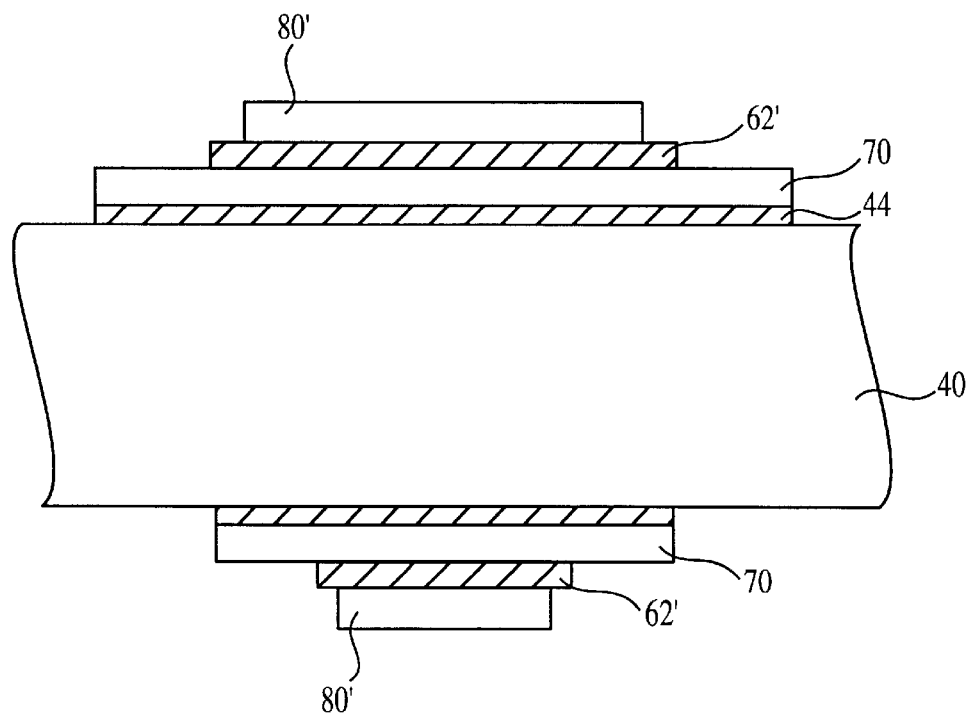
FIG. 25 is a cross-sectional view of the representative microtransformer according to the present invention at a stage of processing subsequent to that shown in FIG. 24.

Reference is now made to FIG. 25, which illustrates the beginning of the deposition of coil winding structure 100' (FIG. 28) by a dry process, such as sputtering. The first step under this dry process, as shown in FIG. 25, is the formation of a conductive material layer 80' over the second insulating layer 62', which in turn covers magnetic layer 70. The conductive material layer 80' is formed of copper (Cu), or other suitable conductive material, having a thickness of approximately 10 µm.

Figure 26:
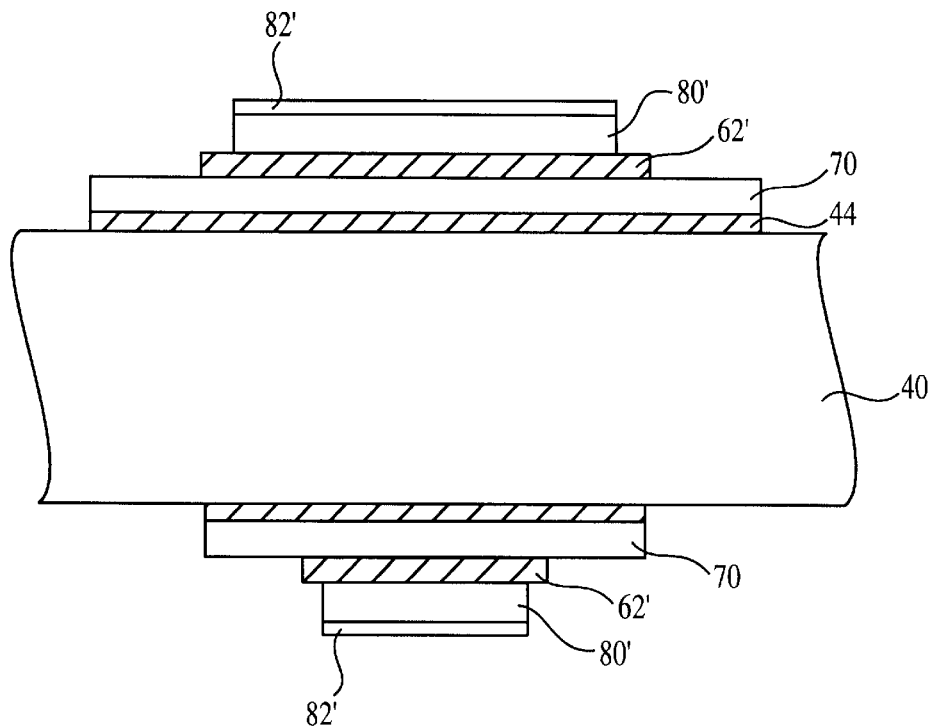
FIG. 26 is a cross-sectional view of the representative microtransformer according to the present invention at a stage of processing subsequent to that shown in FIG. 25.
Figure 27:
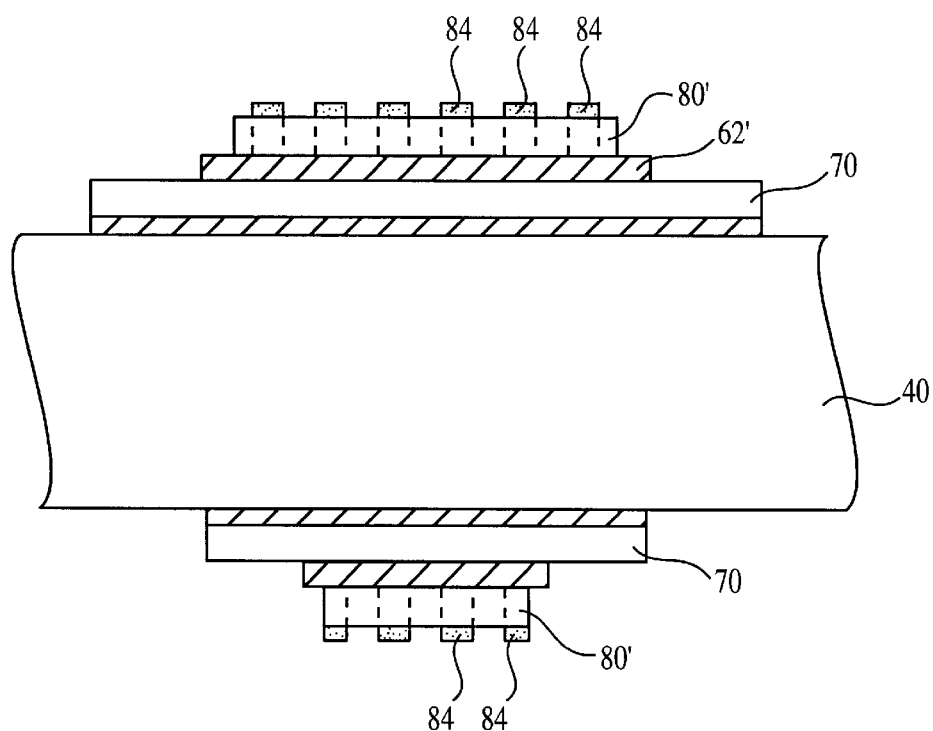
FIG. 27 is a cross-sectional view of the representative microtransformer according to the present invention at a stage of processing subsequent to that shown in FIG. 26.

As illustrated in FIG. 26, as part of the patterning of conductive material layer 80', a photoresist film 82' is coated on the conductive copper layer 80'. A UV mask (not shown) is placed over the photoresist film 82', which has the conductor pattern therein for forming a coil layer. After the UV light contacting and developing of the photoresist layer 82', developed photoresist areas 84 are left as shown in FIG. 27.

Figure 28:
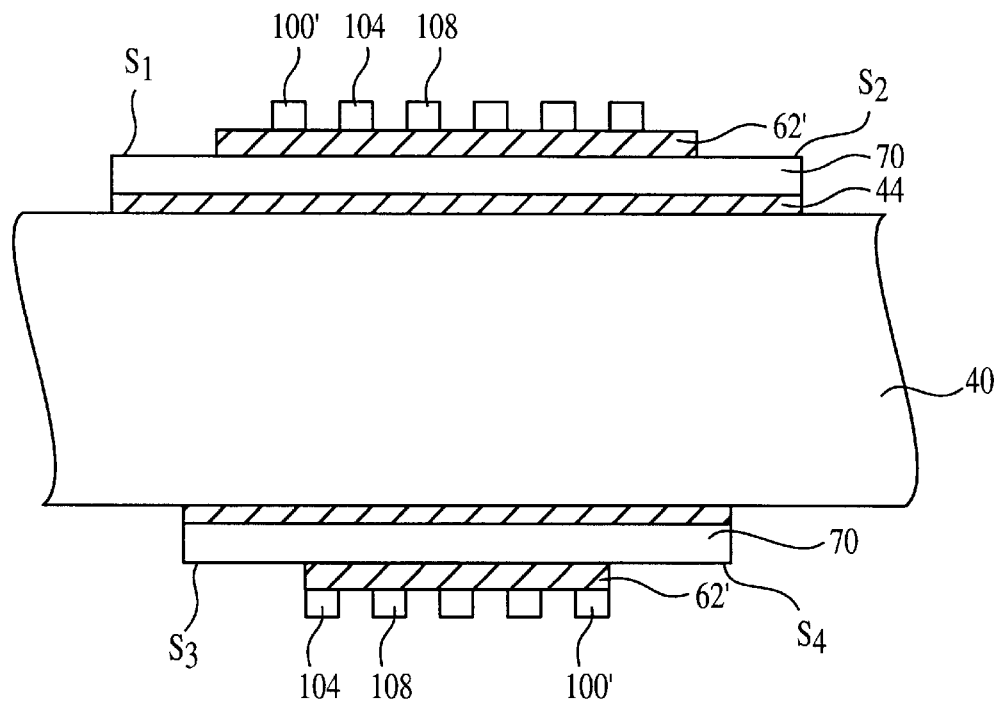
FIG. 28 is a cross-sectional view of the representative microtransformer according to the present invention at a stage of processing subsequent to that shown in FIG. 27.

The underlying conductive material layer 80' is next etched through the developed photoresist film 82'. Etching can be done with a plasma etch and then the remaining photoresist film areas 84 are removed. The resultant coil structure 100' is illustrated in FIG. 28. The coil structure 100' which is formed contains both primary, such as 104, and secondary, such as 108, coils of microtransformer 14 with their windings interleaved. Alternatively, if desired, the conductive material layer 80' can be etched to form only a single continuous coil.

Figure 29:
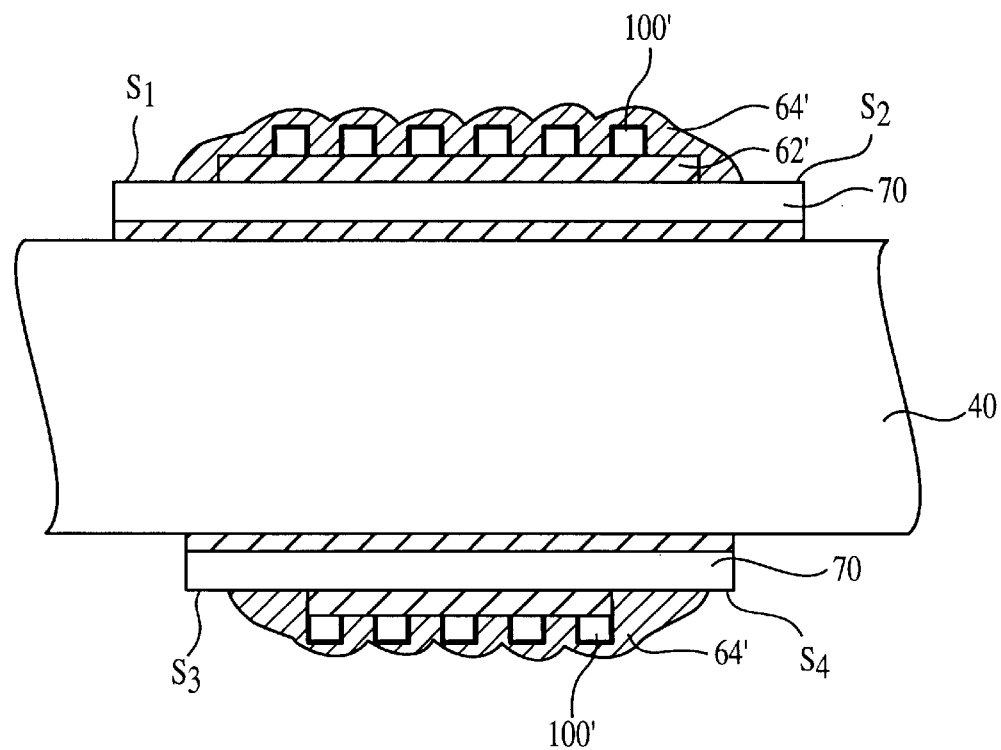
FIG. 29 is a cross-sectional view of the representative microtransformer according to the present invention at a stage of processing subsequent to that shown in FIG. 28.
Figure 30:
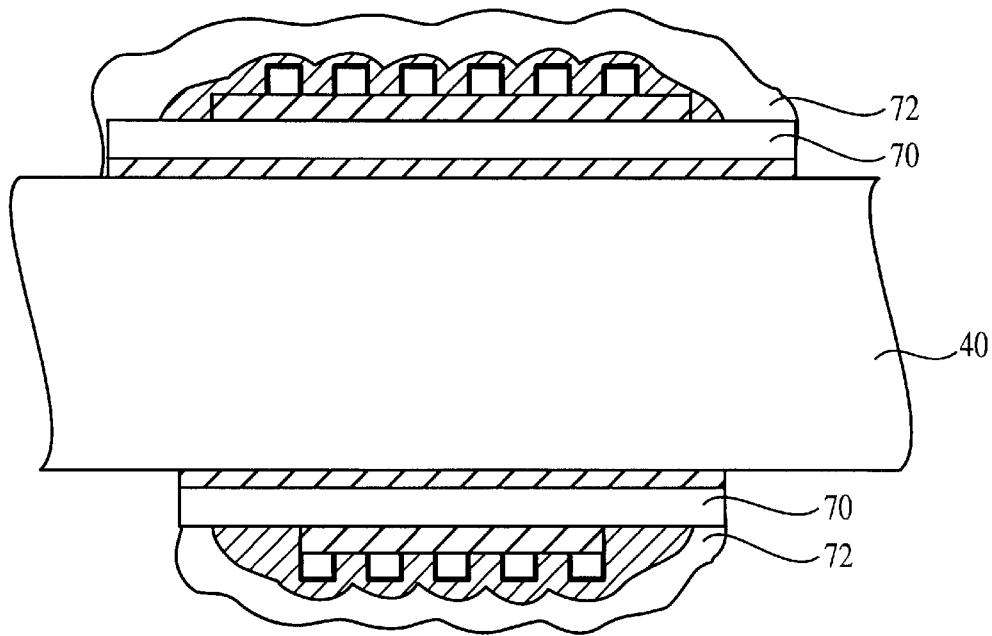
FIG. 30 is a cross-sectional view of the representative microtransformer according to the present invention at a stage of processing subsequent to that shown in FIG. 29.

Reference is now made to FIG. 29. Following coil formation, a second insulating layer 64' is applied over coil winding structure 100'. Next, a second soft magnetic layer 72 is deposited over the entire area between holes 43 and 45, that is the area illustrated in FIG. 6 as the area bounded by letters A, B, C and D on the top surface of the substrate; the area of the side wall of hole 43 bounded by the letters C, D, G and H; the area of the side wall of the hole 45 bounded by the letters A, B, E and F; and the area on the lower surface of the substrate 40 bounded by the letters E, F, G and H. The second soft magnetic layer 72 also covers regions $S_1$ and $S_2$ of the upper surface of the upper first magnetic layer 70 as well as regions $S_3$ and $S_4$ of the lower surface of the lower first magnetic layer 70, so that first magnetic layer 70 is in contact with the second soft magnetic layer 72. This is illustrated in FIG. 30.

Figure 31:
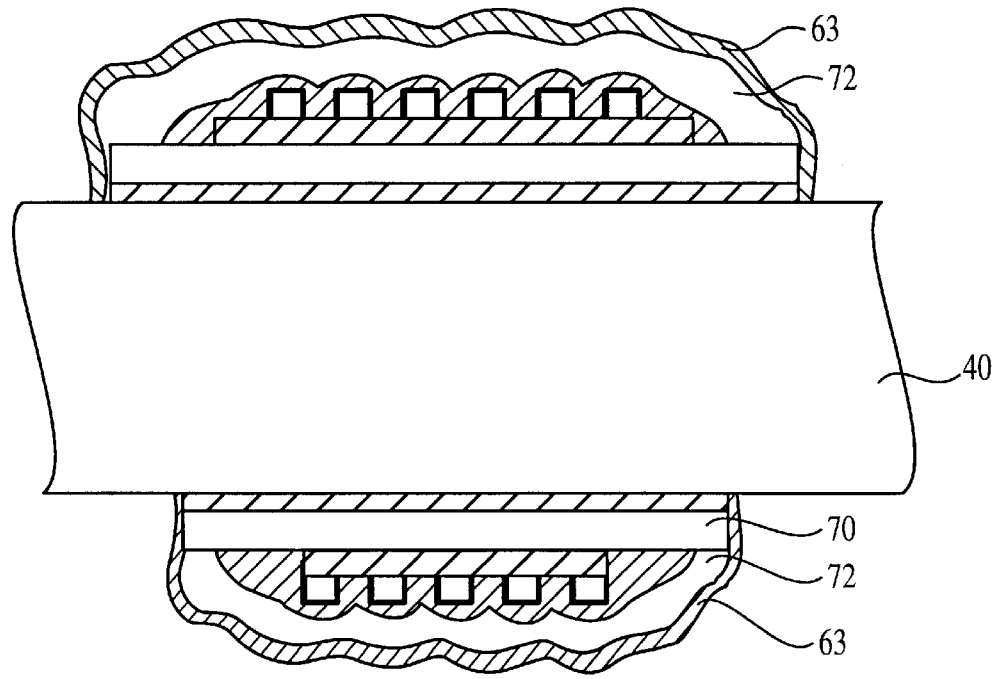
FIG. 31 is a cross-sectional view of the representative microtransformer according to the present invention at a stage of processing subsequent to that shown in FIG. 30.
Figure 32:
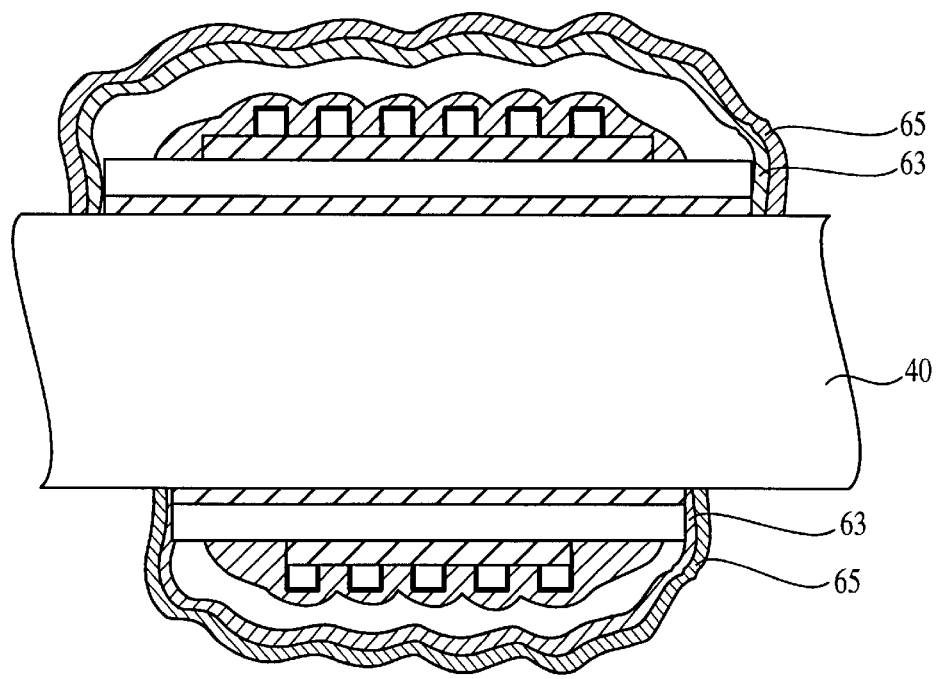
FIG. 32 is a cross-sectional view of the representative microtransformer according to the present invention at a stage of processing subsequent to that shown in FIG. 31.

Following the coupling of the two soft magnetic layers, a top protective layer 63 and a passivating layer 65 are next deposited over the second soft magnetic layer 72, as shown in FIGS. 31–32.

Figure 33:
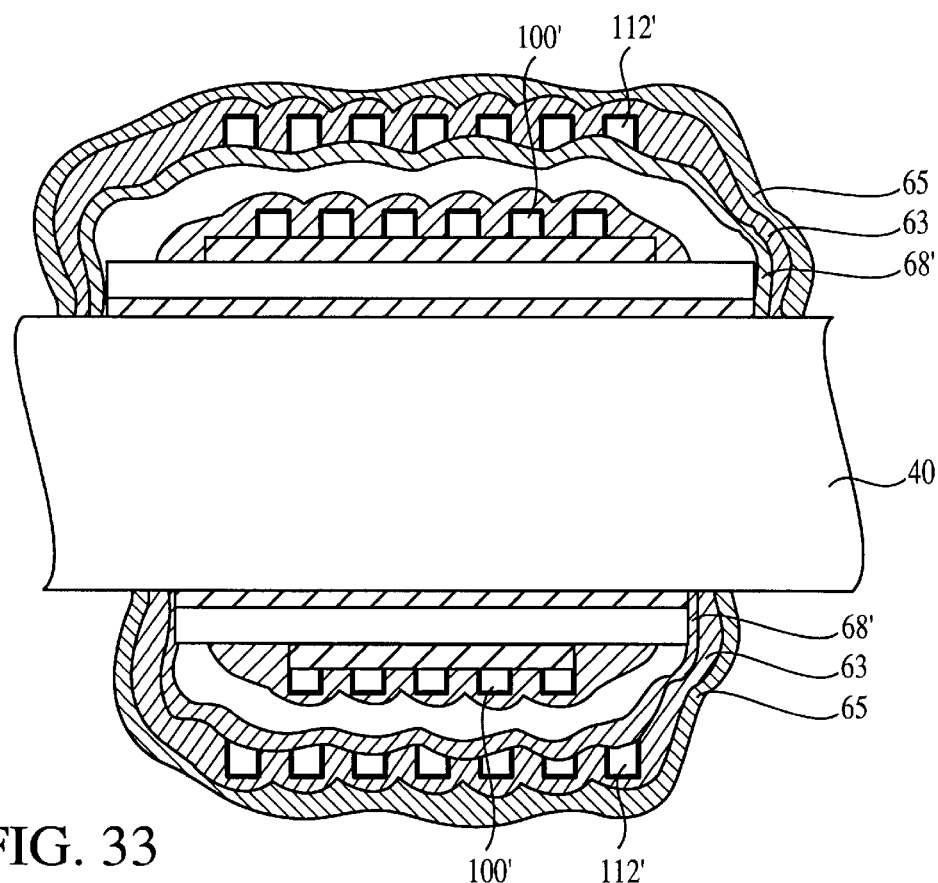
FIG. 33 is a cross-sectional view of the representative microtransformer according to the present invention at a stage of processing subsequent to that shown in FIG. 32 and in accordance with a fifth embodiment of the present invention.

According to another embodiment of the present invention, to further improve the magnetic flux coupling, a second coil winding structure 112' can be deposited on top of the first coil winding structure 100' using the same processing techniques as used to form coil winding structure 100'. In this embodiment, which is illustrated in FIG. 33, the first coil winding structure 100' can be one of the primary and secondary windings of the microtransformer 14, while the second coil winding structure 112' can be used as the other of the primary and secondary winding. The second winding layer 112' may be provided with several output taps to provide different output voltages.

Although FIG. 33 illustrates formation of the second coil winding layer 112' on insulating layer 68' without a planarization of the insulating layer 68', a CMP process could also be used on insulating layer 68' to planarize it prior to the formation of the second coil winding layer 112'.

The IC mictrotransformer 14 provided by the present invention is capable of operating at high frequencies, with high efficiency, low losses, and high magnetic permeability. The coil winding structure (100 in FIGS. 14–20 and 100' in FIGS. 28–32; 100, 112 in FIG. 21 and 100', 112' in FIG. 33) of mictrotransformer 14 further allows for a reduction in the overall size while retaining an optimal geometry for the production of high quality (Q) factors. A Q factor is dependent upon resistance and inductance. In the industry, maximizing Q has proven difficult mainly because of the necessary limitations set by theoretically effective integrated systems (i.e. size, power, etc.). Thus, using the through-holes in a semiconductor substrate for winding the primary and the secondary windings, the coil winding structure 100 increases the magnetic flux coupling and the inductance, which in turn affords a higher Q factor.

The material for the substrate 40 is not limited as long as the four surfaces at issue are electrically insulated to prevent undesired electrical shortings. For example, other substrates such as quartz, $Al_2O_3$/TiC, ceramics, ferromagnetic materials, and semiconductor material other than silicon are also appropriate substrate materials. Nevertheless, to promote the readiness for micro processing and facilitate the production of a one-chip device, it is desirable that the substrate 40 be formed of a semiconductor material.

Although the drawings show a relatively thin substrate 40 in comparison to the thickness of the insulating layers 62, 63, 64, 67, 68, 62', 64' or 68', in actuality these insulating layers are thin in comparison to the substrate 40. However, having a thickness of approximately 1 to 2 μm, these insulating layers are approximately twice or more as thick as oxide layers normally employed in IC processes. Further, as mentioned above, insulating layers, such as layers 62, 64, 68, 62', 64' or 68', may be necessary or not depending on whether the magnetic material for the magnetic layers, which contact the coil windings 100, 112, 100' or 112', is a conducting or an insulating magnetic material.

The insulating material used for the insulating layers mentioned above is preferably an inorganic compound such as silicon oxide (for example $SiO_2$ produced by sputtering or CVD or PECVD, and SiO by evaporation) or silicon nitride. Organic compounds may be used also. For example, a high-temperature polyimide from Du Pont may be used for the insulating layers if the subsequent processes are not subjected to a high temperature processing.

The primary and secondary coil conductors of microtransformer 14 are made of low-resistivity metal. Although copper (Cu) has been described above as exemplary, any low resistivity metal can be used including aluminum (Al), Al-alloys, gold (Au), Au-alloys, silver (Ag), or Ag-alloys. An alloy of copper, such as Al—Cu alloy, may be used also. Materials for coil conductors, however, are not limited to these examples. The rated current of the coil winding structure 100 or 100' is proportional to the permissible current density of the low-resistivity material of the conductors. Hence, it is desirable that the material be one that is highly resistant to electromigration, stress migration, or thermal migration.

A high performance system-on-chip may be provided by integrating the other components of the DC-DC converter and load circuits in, or on, other areas of substrate 40 as shown in FIG. 2. Alternatively, substrate 40 can be used as an interposer for mounting other IC chips to it, since it contains the fabricated transformer 14 and the other components of the DC-DC converter, using, for example, MBB bonding technology as is known in the art to produce a chip-on-chip system.

Figure 34:
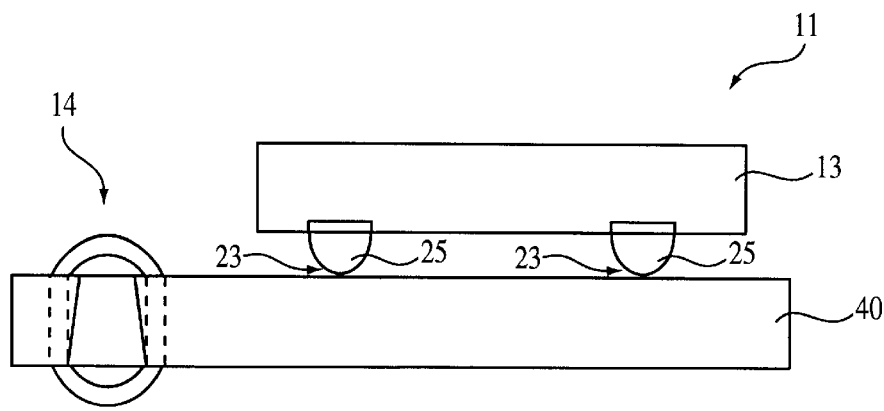
FIG. 34 is a cross-sectional view of an integrated circuit package containing the representative microtransformer of the present invention electrically connected to a die.

FIG. 34 illustrates the interconnection between the substrate 40, containing fabricated microtransformer 14, and a die 13, which together produce a complete IC package 11. Bonding sites 23 are defined on substrate 40. During packaging, an electrical connection is formed between the die 13 and substrate 40 by placing the die 13 onto the substrate 40 so that bonding sites 23 come into contact with electrical interconnect structures 25, such as solder balls, to thereby electrically and mechanically connect together die 13 and substrate 40.

Figure 35:
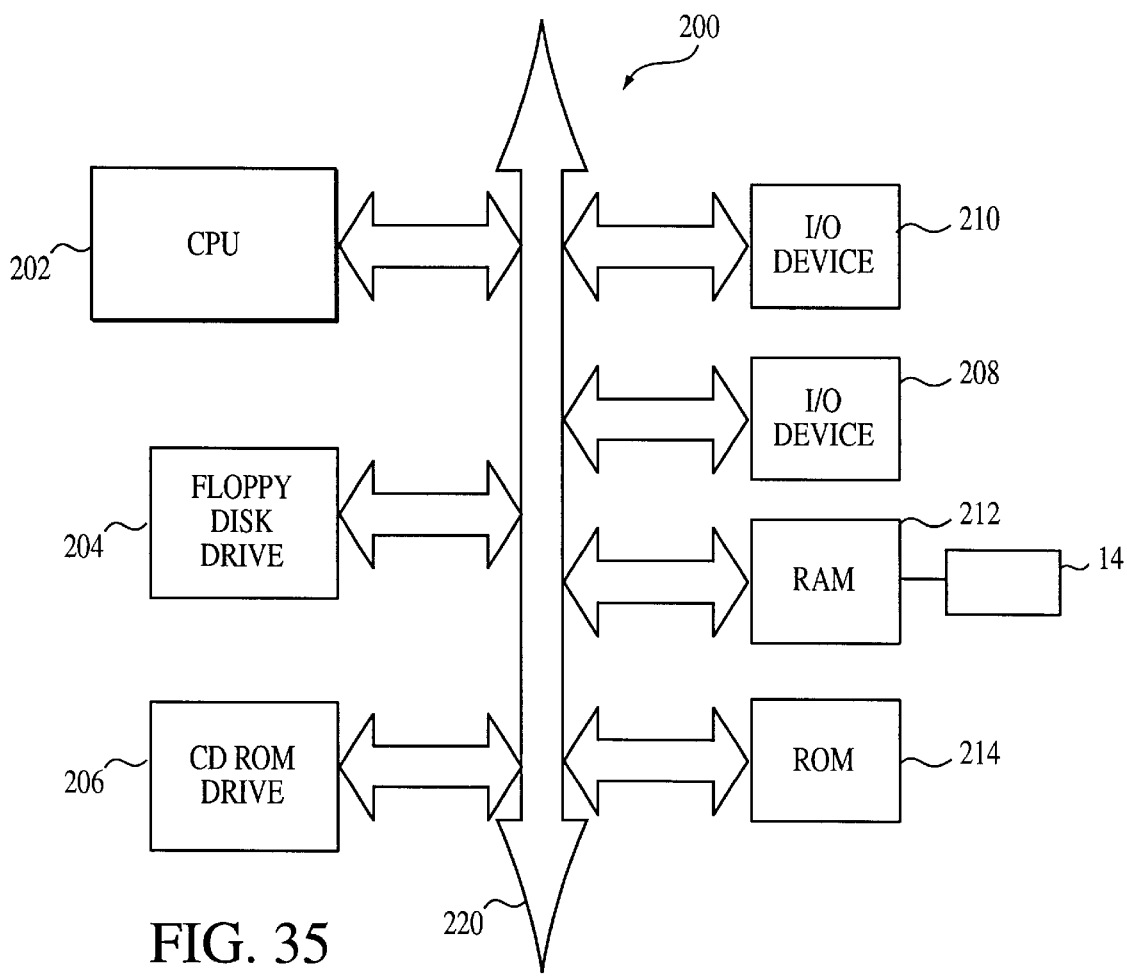
FIG. 35 is a schematic diagram of a processor system incorporating a microtransformer of the present invention.

FIG. 35 is a block diagram of a processor-based system 200 utilizing RAM 212 memory, which contains at least one integrated circuit having a DC-DC converter constructed in accordance with the present invention. That is, the RAM 212 employs a DC-DC converter containing the microtransformer 14 of the invention. The processor-based system 200 may be a computer system, a process control system, or any other system employing a processor and associated memory.

The system 200 includes a central processing unit (CPU) 202, for example, a microprocessor, that communicates with the RAM 212 and an I/O device 208 over a bus 220. It must be noted that the bus 220 may be a series of buses and bridges commonly used in a processor-based system, but for convenience purposes only, the bus 220 has been illustrated as a single bus.

A second I/O device 210 is illustrated but is not necessary to practice the invention. The processor-based system 200 also includes read-only memory (ROM) 214 and may include peripheral devices such as a floppy disk drive 204 and a compact disk (CD) ROM drive 206, which also communicate with the CPU 202 over the bus 220, as is well known in the art. In addition, the CPU 202 may be integrated on the same chip with one or more of the memory RAM 212 and/or ROM 214.

The above description and drawings illustrate preferred embodiments that achieve the features and advantages of the present invention. It is not intended that the present invention be limited to the illustrated embodiments, as many modifications and substitutions can be made without departing from the spirit and scope of the invention. Any modification of the present invention that comes within the scope of the following claims should be considered part of the present invention.

What is claimed as new and desired to be protected by Letters Patent of the United States is:

1. An electromagnetic element comprising:
a substrate with at least a first and second through-holes that define between them a coil winding area that includes a top surface of said substrate, a bottom surface of said substrate, and side surfaces of said through-holes;
a first layer of magnetic material provided on said substrate in said coil winding area;
a first layer of electrically conductive material forming at least one coil winding provided on said substrate in said coil winding area; and
a second layer of magnetic material formed over said first layer of electrically conductive material, said second layer of magnetic material being connected with said first layer of magnetic material.

2. The electromagnetic element of claim 1, wherein said conductive material is copper or an alloy of copper.

3. The electromagnetic element of claim 1, wherein said conductive material is aluminum or an alloy of aluminum.

4. The electromagnetic element of claim 1, wherein said first layer of electrically conductive material forms two coil windings.

5. The electromagnetic element of claim 4, wherein said electromagnetic element is a transformer and said two coil windings form the primary and secondary coil windings of said transformer.

6. The electromagnetic element of claim 1 further comprising a first insulating layer between said substrate and said first layer of magnetic material.

7. The electromagnetic element of claim 6, wherein said first insulating layer is formed of a high temperature polymer film.

8. The electromagnetic element of claim 7, wherein said high temperature polymer film is a polyimide.

9. The electromagnetic element of claim 6, wherein said first insulating layer is formed of an oxide or a nitride.

10. The electromagnetic element of claim 6, wherein said first insulating layer has a thickness of 0.5 to 1 μm.

11. The electromagnetic element of claim 6 further comprising a second insulating layer between said first layer of magnetic material and said first layer of electrically conductive material.

12. The electromagnetic element of claim 11, wherein said second insulating layer is formed of a high temperature polymer film.

13. The electromagnetic element of claim 12, wherein said high temperature polymer film is a polyimide.

14. The electromagnetic element of claim 11, wherein said second insulating layer is formed of an oxide or a nitride.

15. The electromagnetic element of claim 11, wherein said second insulating layer has a thickness of 0.5 to 1 µm.

16. The electromagnetic element of claim 11 further comprising a third insulating layer between said first layer of electrically conductive material and said second layer of magnetic material.

17. The electromagnetic element of claim 16, wherein said third insulating layer is formed of a high temperature polymer film.

18. The electromagnetic element of claim 17, wherein said high temperature polymer film is a polyimide.

19. The electromagnetic element of claim 16, wherein said third insulating layer is formed of an oxide or a nitride.

20. The electromagnetic element of claim 16, wherein said third insulating layer has a thickness of 0.5 to 1 µm.

21. The electromagnetic element of claim 16 further comprising a second layer of electrically conductive material forming at least one coil on said second layer of magnetic material.

22. The electromagnetic element of claim 21 further comprising an insulating layer between said second layer of magnetic material and said second layer of electrically conductive material.

23. The electromagnetic element of claim 21, wherein said second layer of conductive material is copper or an alloy of copper.

24. The electromagnetic element of claim 21 wherein said second layer of conductive material is aluminum or an alloy of aluminum.

25. The electromagnetic element of claim 21, wherein said second layer of electrically conductive material forms two coils.

26. The electromagnetic element of claim 21 further comprising a top protective insulating layer over said second layer of electrically conductive material.

27. The electromagnetic element of claim 26 further comprising a passivating layer over said top protective insulating layer.

28. The electromagnetic element of claim 1, wherein said first layer of magnetic material is made of Fe—X—N alloy or Fe—X—B—N alloy, wherein X is at least one atom selected from the group consisting of Zr, Hf, Ti, Nb, Ta, V, Mo, W, and Cr.

29. The electromagnetic element of claim 28, wherein said first layer of magnetic material is further formed of a plurality of thin soft magnetic layers and at least one insulating spacer layer formed between said thin soft magnetic layers.

30. The electromagnetic element of claim 29, wherein said insulating spacer layer is formed of a material selected form the group consisting of Permalloy (NiFe), NiFeMo, Co—Zr, CoZrRe, CoFeSiB, CoNbZr, and Co—Cr—O granular films.

31. The electromagnetic element of claim 1, wherein said second layer of magnetic material is made of Fe—X—N alloy or Fe—X—B—N alloy, wherein X is at least one atom selected from the group consisting of Zr, Hf, Ti, Nb, Ta, V, Mo, W, and Cr.

32. The electromagnetic element of claim 21, wherein said second layer of magnetic material is further formed of a plurality of thin soft magnetic layers and at least one insulating spacer layer formed between said thin soft magnetic layers.

33. The electromagnetic element of claim 32, wherein said insulating spacer layer is formed of a material selected form the group consisting of Permalloy (NiFe), NiFeMo, Co—Zr, CoZrRe, CoFeSiB, CoNbZr, and Co—Cr—O granular films.

34. The electromagnetic element of claim 1 further comprising a top protective insulating layer over said second layer of magnetic material.

35. The electromagnetic element of claim 34 further comprising a passivating layer over said top protective insulating layer.

36. The electromagnetic element of claim 1, wherein said substrate is a semiconductor substrate.

37. The electromagnetic element of claim 36, wherein said semiconductor substrate is a silicon substrate.

38. The electromagnetic element of claim 36, wherein said semiconductor substrate is a germanium substrate.

39. The electromagnetic element of claim 36, wherein said semiconductor substrate is a gallium arsenide substrate.

40. The electromagnetic element of claim 1, wherein said substrate is a ceramic substrate.

41. The electromagnetic element of claim 1, wherein said substrate is a quartz substrate.

42. The electromagnetic element of claim 1, wherein said substrate is an $Al_2O_3$/TiC substrate.

43. The electromagnetic element of claim 1, wherein said electromagnetic element is selected from the group consisting of a microtransformer and a microinductor.

44. The electromagnetic element of claim 1, wherein said semiconductor substrate further contains circuitry for a DC-DC converter.

45. The electromagnetic element of claim 44, wherein said semiconductor substrate further contains circuitry for a power supply which includes said DC-DC converter.

46. A method for fabricating a microtransformer comprising the steps of:
    providing a substrate with at least a first and second through-holes that define between them a coil winding area that includes a top surface of said substrate, a bottom surface of said substrate, and side surfaces of said through-holes;
    forming a first layer of magnetic material on said substrate in said coil winding area;
    forming a first layer of electrically conductive material forming at least one coil winding on said substrate in said coil winding area; and
    forming a second layer of magnetic material over said first layer of electrically conductive material, said second layer of magnetic material being connected with said first layer of magnetic material.

47. The method of claim 46, wherein said first layer of electrically conductive material has two coils.

48. The method of claim 46 further comprising the step of providing a first insulating layer between said first layer of magnetic material and said substrate.

49. The method of claim 48 further comprising the step of providing a second insulating layer between said first layer of magnetic material and said first layer of electrically conductive material.

50. The method of claim 49 further comprising the step of providing a third insulating layer between said first layer of electrically conductive material and said second layer of magnetic material.

51. The method of claim 50 further comprising the step of providing a top protective insulating layer over said second layer of magnetic material.

52. The method of claim 51 further comprising the step of providing a passivating layer over said top protective insulating layer.

53. The method of claim 46 further comprising the step of forming a second layer of electrically conductive material forming at least one coil on said second layer of magnetic material.

54. The method of claim 53 further comprising the step of forming an insulating layer between said second layer of magnetic material and said second layer of electrically conductive material.

55. The method of claim 53 further comprising the step of providing a top protective insulating layer over said second layer of electrically conductive material.

56. The method of claim 55 further comprising the step of providing a passivating layer over said top protective insulating layer.

57. The method of claim 46, wherein said substrate is a semiconductor substrate.

58. The method of claim 57, wherein said semiconductor substrate is a silicon substrate.

59. The method of claim 57, wherein said semiconductor substrate is a germanium substrate.

60. The method of claim 57, wherein said semiconductor substrate is a gallium arsenide substrate.

61. The method of claim 46, wherein said substrate is a ceramic substrate.

62. The method of claim 46, wherein said substrate is a quartz substrate.

63. The method of claim 46, wherein said substrate is an $Al_2O_3/TiC$ substrate.

64. A system-on-chip comprising:
   a substrate having a through-hole microtransformer formed thereon, wherein said through-holes microtransformer is formed in a coil winding area defined by first and second through-holes in said substrate, said coil winding area including a top surface of said substrate, a bottom surface of said substrate, and side surfaces of said through-holes, said microtransformer further comprising a first layer of magnetic material provided on said substrate in said coil winding area, a first layer of electrically conductive material forming at least one coil winding provided on said substrate in said coil winding area, and a second layer of magnetic material formed over said first layer of electrically conductive material, said second layer of magnetic material being connected with said first layer of magnetic material; and
   at least one integrated circuit chip attached to said substrate and electrically connected to said substrate.

65. The system-on-chip of claim 64, wherein said layer of electrically conductive material forms two coil windings.

66. The system-on-chip of claim 65, wherein said two coil windings form a primary and secondary coil windings of said microtransformer.

67. The system-on-chip of claim 64, wherein said microtransformer further comprises a first insulating layer between said substrate and said first layer of magnetic material.

68. The system-on-chip of claim 67, wherein said microtransformer further comprises a second insulating layer formed between said first layer of magnetic material and said first layer of electrically conductive material.

69. The system-on-chip of claim 68, wherein said microtransformer further comprises a third insulating layer between said first layer of electrically conductive material and said second layer of magnetic material.

70. The system-on-chip of claim 69, wherein said microtransformer further comprises a top protective insulating layer over said second layer of magnetic material.

71. The system-on-chip of claim 70, wherein said microtransformer further comprises a passivating layer over said top protective insulating layer.

72. The system-on-chip of claim 69, wherein said microtransformer further comprises a second layer of electrically conductive material forming at least one coil on said second layer of magnetic material.

73. The system-on-chip of claim 72 further comprising an insulating layer between said second layer of magnetic material and said second layer of electrically conductive material.

74. The system-on-chip of claim 73, wherein said microtransformer further comprises a top protective insulating layer over said second layer of electrically conductive material.

75. The system-on-chip of claim 74, wherein said microtransformer further comprises a passivating layer over said top protective insulating layer.

76. The system-on-chip of claim 64, wherein said substrate is a semiconductor substrate.

77. The system-on-chip of claim 76, wherein said semiconductor substrate is a germanium substrate.

78. The system-on-chip of claim 76, wherein said semiconductor substrate is a gallium arsenide substrate.

79. The system-on-chip of claim 64, wherein said substrate is a ceramic substrate.

80. The system-on-chip of claim 64, wherein said substrate is a quartz substrate.

81. The system-on-chip of claim 64, wherein said substrate is an $Al_2O_3/TiC$ substrate.

82. The system-on-chip of claim 64, wherein said at least one chip contains analog circuitry.

83. The system-on-chip of claim 64, wherein said at least one chip contains digital circuitry.

84. The system-on-chip of claim 64 further comprising a power supply on said substrate.

85. The system-on-chip of claim 64 further comprising a DC-DC converter on said substrate.

86. A processor-based system, comprising:
   a processor; and
   an integrated circuit coupled to said processor, said integrated circuit including a through-hole microtransformer, said microtransformer being formed in a coil winding area defined by a first and second through-holes in a substrate, said coil winding area including a top surface of said substrate, a bottom surface of said substrate, and side surfaces of said through-holes, said microtransformer further comprising a first layer of magnetic material provided on said substrate in said coil winding area, a first layer of electrically conductive material forming at least one coil winding provided on said substrate in said coil winding area, and a second layer of magnetic material connected with said first layer of magnetic material.

87. The processor-based system of claim 86, wherein said microtransformer further comprises a first insulating layer formed between said substrate and said first layer of magnetic material.

88. The processor-based system of claim 87, wherein said microtransformer further comprises a second insulating layer formed between said first layer of magnetic material and said first layer of electrically conductive material.

89. The processor-based system of claim 88, wherein said microtransformer further comprises a third insulating layer between said first layer of electrically conductive material and said second layer of magnetic material.

90. The processor-based system of claim 89, wherein said microtransformer further comprises a top protective insulating layer over said second layer of magnetic material.

91. The processor-based system of claim 90, wherein said microtransformer further comprises a passivating layer over said top protective insulating layer.

92. The processor-based system of claim 89, wherein said microtransformer further comprises a second layer of electrically conductive material forming at least one coil on said second layer of magnetic material.

93. The processor-based system of claim 92 further comprising an insulating layer between said second layer of magnetic material and said second layer of electrically conductive material.

94. The processor-based system of claim 93, wherein said microtransformer further comprises a top protective insulating layer over said second layer of electrically conductive material.

95. The processor-based system of claim 94, wherein said microtransformer further comprises a passivating layer over said top protective insulating layer.

96. The processor-based system of claim 86, wherein said integrated circuit is part of a memory circuit.

97. The processor-based system of claim 86, wherein said processor and said integrated circuit are integrated on same chip.

98. The processor-based system of claim 86, wherein said substrate is a semiconductor substrate.

99. The processor-based system of claim 98, wherein said semiconductor substrate is a germanium substrate.

100. The processor-based system of claim 98, wherein said semiconductor substrate is a gallium arsenide substrate.

101. The processor-based system of claim 86, wherein said substrate is a ceramic substrate.

102. The processor-based system of claim 86, wherein said substrate is a quartz substrate.

103. The processor-based system of claim 86, wherein said substrate is an $Al_2O_3/TiC$ substrate.

* * * * *

UNITED STATES PATENT AND TRADEMARK OFFICE
CERTIFICATE OF CORRECTION

PATENT NO. : 6,420,954 B1
DATED : July 16, 2002
INVENTOR(S) : Kie Y. Ahn et al.

It is certified that error appears in the above-identified patent and that said Letters Patent is hereby corrected as shown below:

Column 13,
Line 66, replace "claim 21" with -- claim 31 --.

Signed and Sealed this

Twelfth Day of November, 2002

Attest:

Attesting Officer

JAMES E. ROGAN
Director of the United States Patent and Trademark Office